US012738308B2

(12) United States Patent
Kawabata

(10) Patent No.: US 12,738,308 B2
(45) Date of Patent: Sep. 15, 2026

(54) SEMICONDUCTOR MEMORY DEVICE AND METHOD FOR CONTROLLING SEMICONDUCTOR MEMORY DEVICE

(71) Applicant: FUJITSU SEMICONDUCTOR MEMORY SOLUTION LIMITED, Kanagawa (JP)

(72) Inventor: Kuninori Kawabata, Kanagawa (JP)

(73) Assignee: RAMXEED LIMITED, Kanagawa (JP)

( * ) Notice: Subject to any disclaimer, the term of this patent is extended or adjusted under 35 U.S.C. 154(b) by 112 days.

(21) Appl. No.: 18/910,619

(22) Filed: Oct. 9, 2024

(65) Prior Publication Data

US 2025/0273255 A1 Aug. 28, 2025

(30) Foreign Application Priority Data

Feb. 26, 2024 (JP) ................................ 2024-026633

(51) Int. Cl.
*G11C 15/00* (2006.01)
*G11C 11/22* (2006.01)

(52) U.S. Cl.
CPC ........ *G11C 11/2273* (2013.01); *G11C 11/221* (2013.01); *G11C 11/2259* (2013.01)

(58) Field of Classification Search
CPC .............. G11C 11/221; G11C 11/2259; G11C 11/2273
See application file for complete search history.

(56) References Cited

U.S. PATENT DOCUMENTS

2010/0103715 A1 4/2010 Takizawa et al.
2011/0085364 A1* 4/2011 Shimano ................ G11C 15/04 365/49.17
2011/0157958 A1 6/2011 Sasaki
2016/0180948 A1* 6/2016 Tanabe .................. G11C 16/24 365/185.21

FOREIGN PATENT DOCUMENTS

JP 2010-102793 5/2010
JP 2011-134383 7/2011

* cited by examiner

*Primary Examiner* — Yong J Choe
(74) *Attorney, Agent, or Firm* — IPUSA, PLLC

(57) ABSTRACT

A semiconductor memory device includes a sense amplifier configured to amplify a difference between data from a first memory cell and data from a second memory cell, a first restoration circuit configured to output, to a first plate line, a level obtained by inverting a first logic level of data on a first bit line, and a second restoration circuit configured to output, to a second plate line, a level obtained by inverting a second logic level of data on a second bit line.

11 Claims, 21 Drawing Sheets

LEX
VDD
LEZ
SA
VSS
WREZo
WREZe
BL
PLe
PLeCNT
PLoCNT
/BL
PLo
PLSXL3
PLSZL3
PLSXL0
PLSZL0
PLSWL
TG
NM
BLSXL3
BLSZL3
BLSXL0
BLSZL0
BLSWL
MC
WLL0
WLL1
WLL2
SARY
BLL0
PLLe0
BLL1
PLLe1
BLL2
PLLe2
BLL3
PLLe3
/BLL0
PLLo0
/BLL1
PLLo1
/BLL2
PLLo2
/BLL3
PLLo3
X
Y

200
SARY
SARY
MC
MC
ONE COLUMN
ONE COLUMN
I/O0
I/O1
I/O2
I/O3
PLR0
I/O<0-3>
WLR<0-3>
PLR<0-3>
BLR<0-3>,/BLR<0-3>
PLR<0-3>
BLSZR<0-3>,
BLSXR<0-3>
BLSWR
SA
SA
SA
SA
BL0
/BL0
BL0
/BL0
BL0
/BL0
BL0
/BL0
BLSZL<0-3>,
BLSXL<0-3>
BLSWL
PLL<3-0>
WLL<3-0>
PLR1
PLL1
BLL0
PLL0
/BLL0
PLL0
BLL1
PLL0
/BLL1
PLL0
BLL2
PLL0
/BLL2
PLL0
BLL3
PLL0
/BLL3
PLL0
BLL<0-3>,
/BLL<0-3>,
PLL1
X
Y

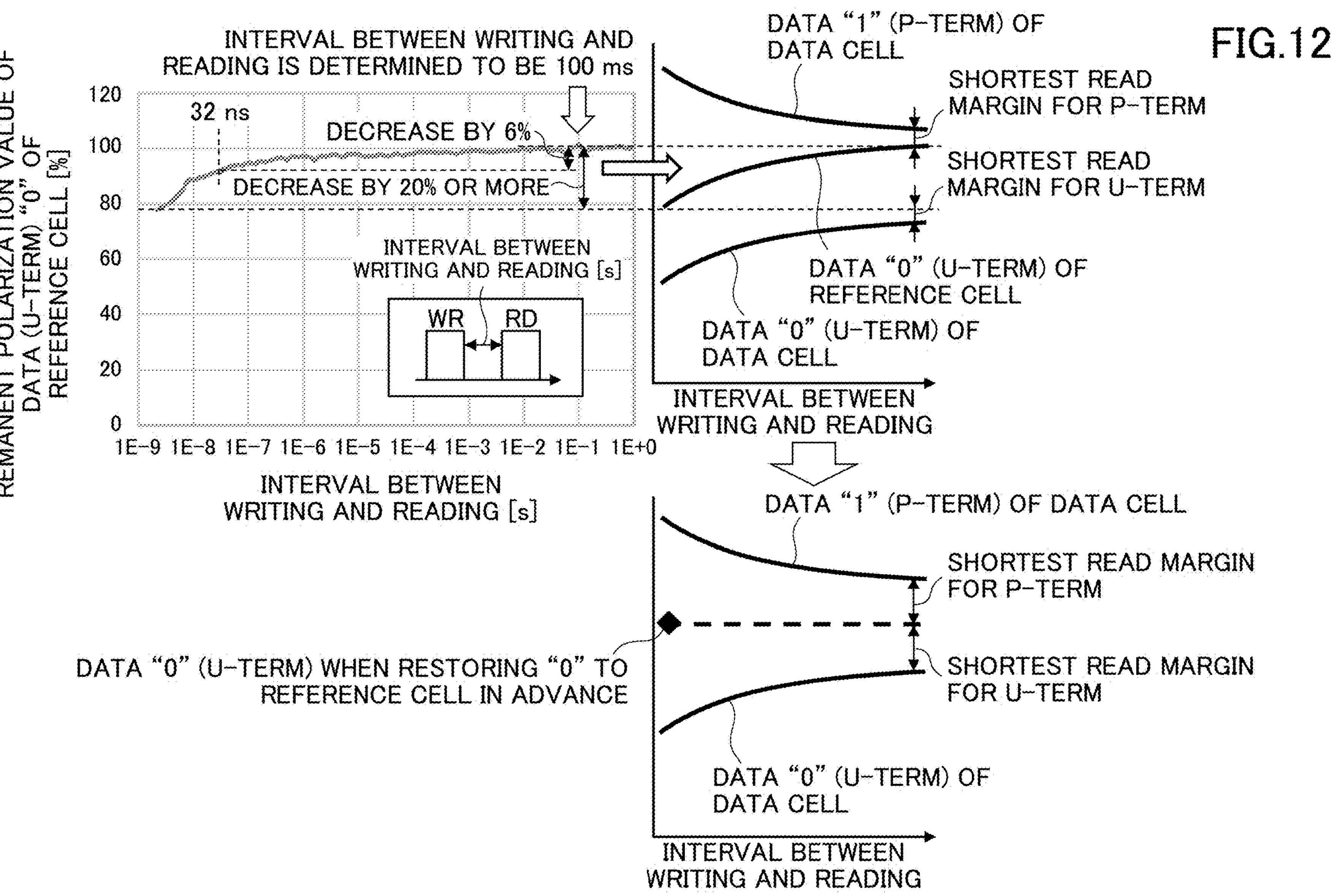
FIG.12
INTERVAL BETWEEN WRITING AND READING IS DETERMINED TO BE 100 ms
REMANENT POLARIZATION VALUE OF DATA (U-TERM) "0" OF REFERENCE CELL [%]
120
100
80
60
40
20
0
32 ns
DECREASE BY 6%
DECREASE BY 20% OR MORE
INTERVAL BETWEEN WRITING AND READING [s]
WR
RD
1E-9 1E-8 1E-7 1E-6 1E-5 1E-4 1E-3 1E-2 1E-1 1E+0
INTERVAL BETWEEN WRITING AND READING [s]
DATA "1" (P-TERM) OF DATA CELL
SHORTEST READ MARGIN FOR P-TERM
SHORTEST READ MARGIN FOR U-TERM
DATA "0" (U-TERM) OF REFERENCE CELL
DATA "0" (U-TERM) OF DATA CELL
INTERVAL BETWEEN WRITING AND READING
DATA "1" (P-TERM) OF DATA CELL
SHORTEST READ MARGIN FOR P-TERM
DATA "0" (U-TERM) WHEN RESTORING "0" TO REFERENCE CELL IN ADVANCE
SHORTEST READ MARGIN FOR U-TERM
DATA "0" (U-TERM) OF DATA CELL
INTERVAL BETWEEN WRITING AND READING

FIG.14

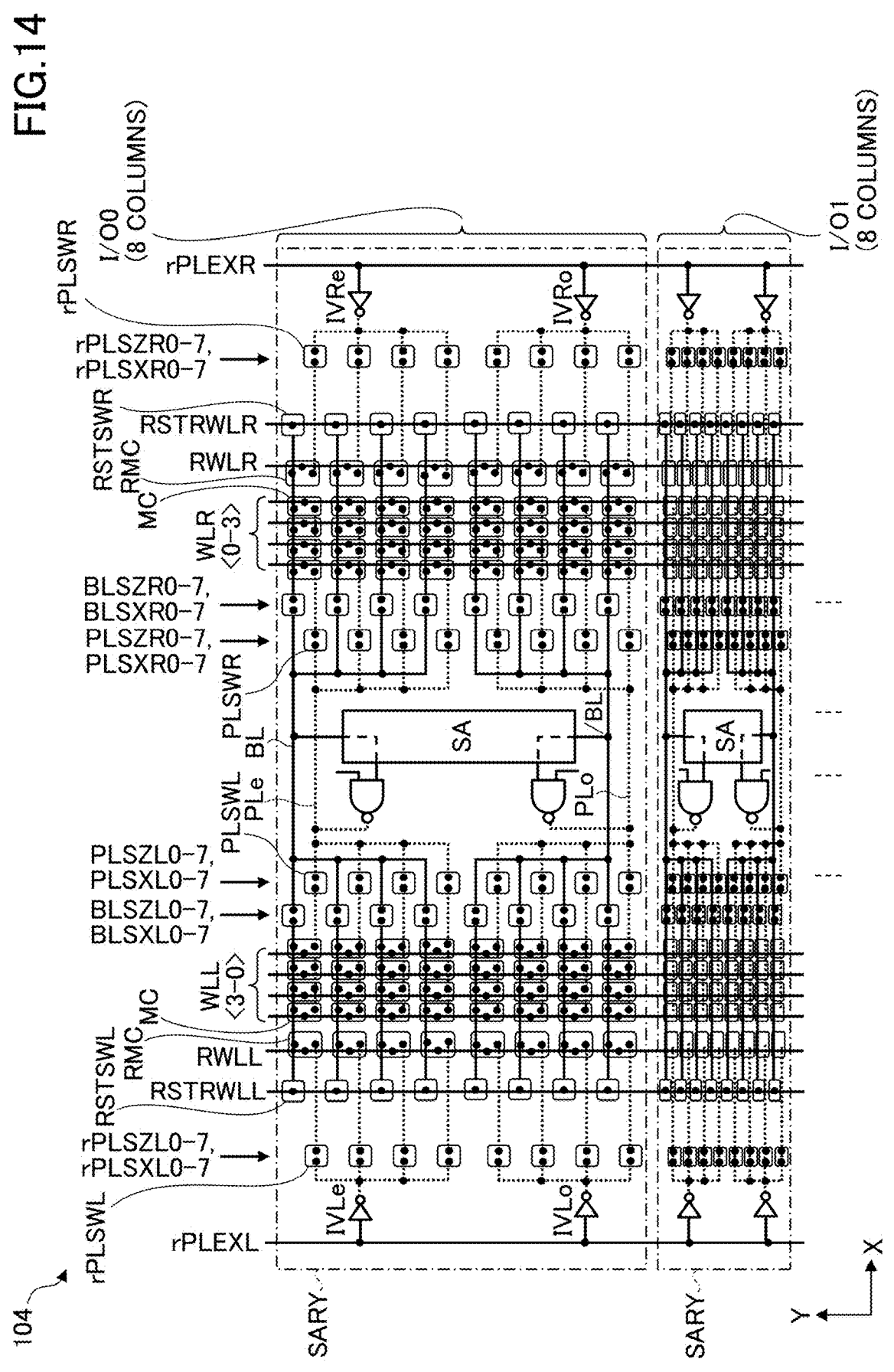

104
rPLSWR
I/O0 (8 COLUMNS)
I/O1 (8 COLUMNS)
rPLEXR
IVRe
IVRo
rPLSZR0-7, rPLSXR0-7
RSTSWR
RSTRWLR
RMC
RWLR
MC
WLR <0-3>
BLSZR0-7, BLSXR0-7
PLSZR0-7, PLSXR0-7
PLSWR
BL
/BL
SA
PLSWL
PLe
PLo
PLSZL0-7, PLSXL0-7
BLSZL0-7, BLSXL0-7
WLL <3-0>
MC
RMC
RSTSWL
RWLL
RSTRWLL
rPLSZL0-7, rPLSXL0-7
rPLSWL
IVLe
IVLo
rPLEXL
SARY
SARY
X
Y

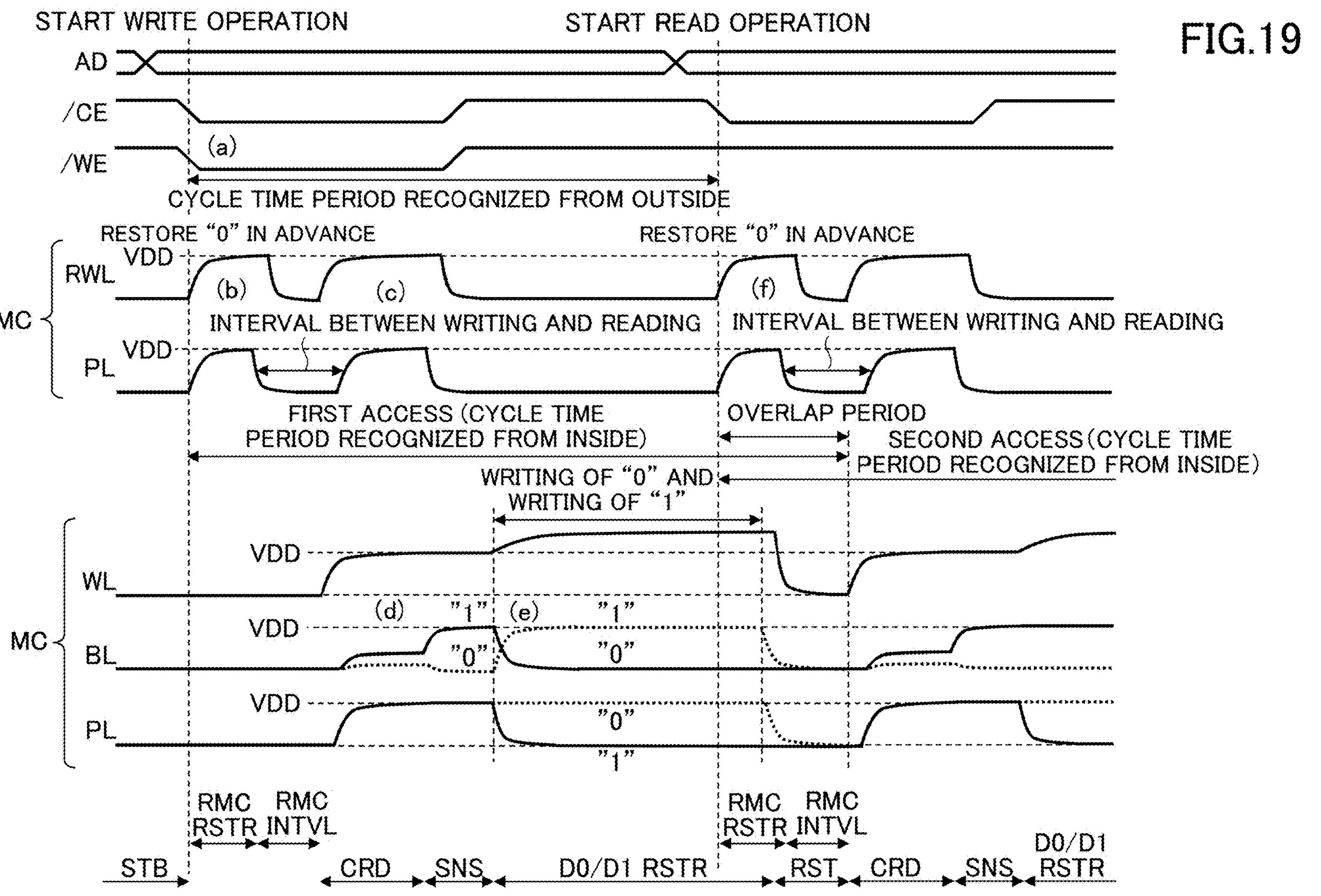
FIG.19
START WRITE OPERATION
START READ OPERATION
AD
/CE
/WE
(a)
CYCLE TIME PERIOD RECOGNIZED FROM OUTSIDE
RESTORE "0" IN ADVANCE
RESTORE "0" IN ADVANCE
RMC
RWL
VDD
(b)
(c)
(f)
INTERVAL BETWEEN WRITING AND READING
INTERVAL BETWEEN WRITING AND READING
PL
VDD
FIRST ACCESS (CYCLE TIME PERIOD RECOGNIZED FROM INSIDE)
OVERLAP PERIOD
SECOND ACCESS (CYCLE TIME PERIOD RECOGNIZED FROM INSIDE)
WRITING OF "0" AND WRITING OF "1"
MC
WL
VDD
(d)
"1"
(e)
"1"
BL
VDD
"0"
"0"
PL
VDD
"0"
"1"
RMC RSTR
RMC INTVL
RMC RSTR
RMC INTVL
STB
CRD
SNS
D0/D1 RSTR
RST
CRD
SNS
D0/D1 RSTR

SEMICONDUCTOR MEMORY DEVICE AND METHOD FOR CONTROLLING SEMICONDUCTOR MEMORY DEVICE

CROSS-REFERENCE TO RELATED APPLICATIONS

This application claims priority under 35 U.S.C. § 119 to Japanese Patent Application No. 2024-026633, filed Feb. 26, 2024, the contents of which are incorporated herein by reference in its entirety.

BACKGROUND

1. Technical Field

The present disclosure relates to a semiconductor memory device and a method for controlling the semiconductor memory device.

2. Description of the Related Art

Semiconductor memory devices with memory cells each of which includes a ferroelectric capacitor are known, where the ferroelectric capacitor functions as a variable capacitive element. The semiconductor memory devices are capable of holding data according to residual polarization of the ferroelectric capacitor. Such a type semiconductor memory device includes bit line pairs via which memory cells are connected to dummy cell capacitors, and includes a sense amplifier for comparing and amplifying voltages associated with the bit line pairs. By connecting a correction capacitor for correcting a reference potential that is read out of a dummy cell capacitor to the bit line pair, a read margin for data from a memory cell is improved (for example, see Patent Document 1). In addition, when a dummy cell capacitor of a ferroelectric material is used, the influence of imprint effects of the dummy cell capacitor is mitigated by applying, to the dummy cell capacitor, a voltage opposite a voltage applied in a read operation, at a timing other than the read operation (for example, see Patent Document 2).

RELATED-ART DOCUMENT

Patent Document

Patent Document 1: Japanese Unexamined Patent Application Publication No. 2010-102793

Patent Document 2: Japanese Unexamined Patent Application Publication No. 2011-134383

SUMMARY

When reading the data out of the memory cell including the ferroelectric capacitor, data “0” or data “1” is destructed by the read operation. For this reason, the data to be destructed after the reading of the data, the data is restored to the memory cell. In this case, there is a problem that a cycle time period upon accessing the memory cell is increased by a time that is required for a restoration operation.

In one aspect, an object of the present disclosure is to reduce a cycle time period upon accessing a memory cell that includes a ferroelectric capacitor.

A semiconductor memory device in the present disclosure includes at least one first memory cell and at least one second memory cell each of which includes a ferroelectric capacitor configured to hold data; a first bit line and a first plate line that are coupled to the first memory cell; a second bit line and a second plate line that are coupled to the second memory cell; a sense amplifier configured to amplify a difference between (i) the data that is read out of the first memory cell upon driving the first plate line and (ii) the data that is read out of the second memory cell upon driving the second plate line; a first restoration circuit configured to output, to the first plate line, a level obtained by inverting a first logic level of the data on the first bit line, the first logic level being obtained by performing differential amplification through the sense amplifier; and a second restoration circuit configured to output, to the second plate line, a level obtained by inverting a second logic level of the data on the second bit line, the second logic level being obtained by performing the differential amplification through the sense amplifier.

BRIEF DESCRIPTION OF THE DRAWINGS

FIG. 12 is a diagram for describing an example of a time variation in a remanent polarization value of each of a reference cell and a memory cell in FIG. 10.

FIG. 14 is a block diagram showing a circuit example of two subarrays of the semiconductor memory device according to another embodiment.

FIG. 19 is a timing chart showing an example of the access operation of the semiconductor memory device including the subarrays in FIG. 14.

DETAILED DESCRIPTION

Hereinafter, various embodiments will be described with reference to the drawings.

Figure 1:
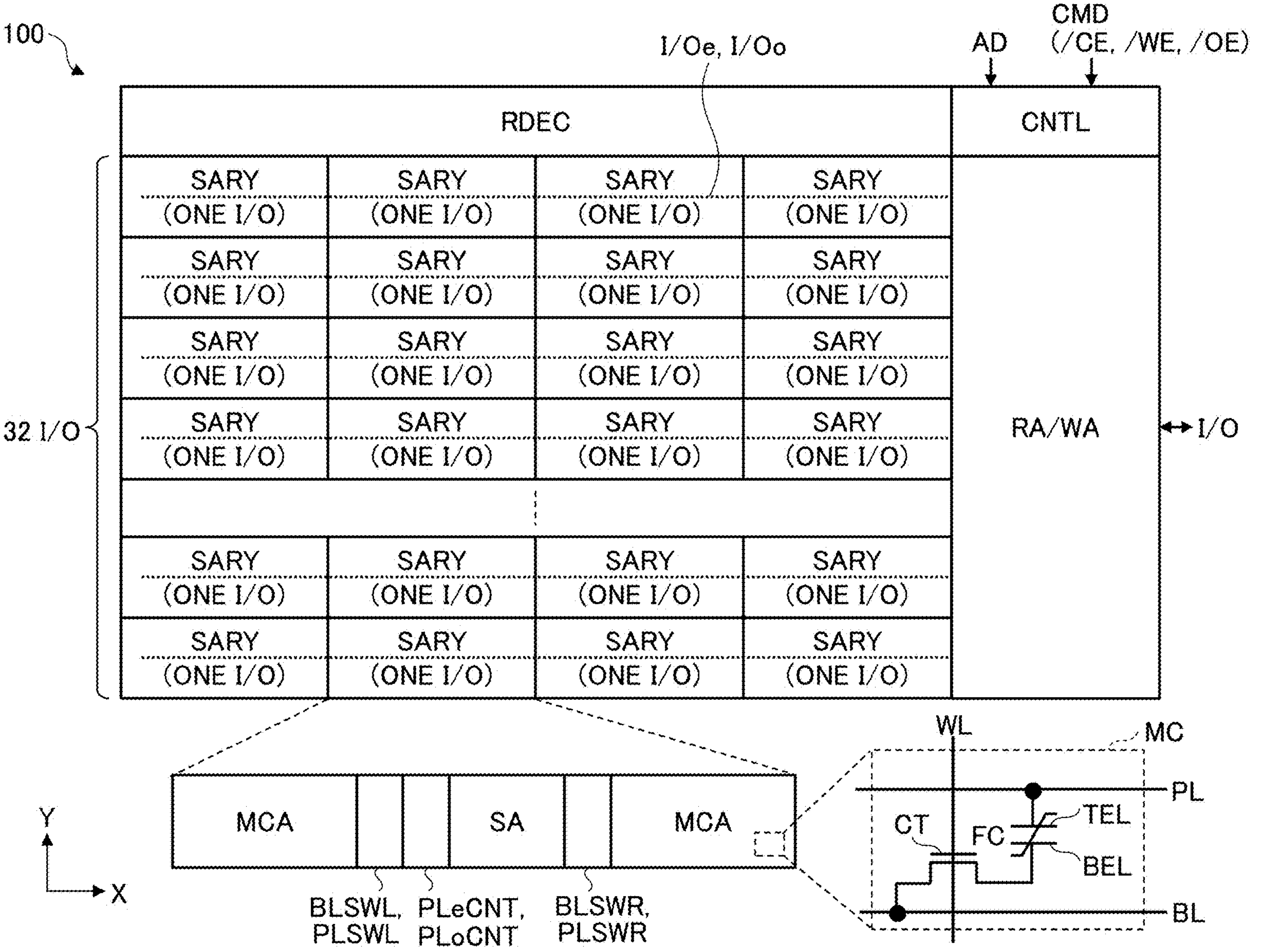
FIG. 1 is a block diagram showing an example of a semiconductor memory device according to one embodiment.

FIG. 1 shows an example of a semiconductor memory device according to one embodiment. A semiconductor memory device 100 shown in FIG. 1 is, for example, a ferroelectric random access memory (FeRAM). The semiconductor memory device 100 is mounted in each of various electronic devices as a single memory device. The semiconductor memory device 100 includes a plurality of subarrays SARY arranged in a matrix pattern along an X direction and a Y direction, a control circuit CNTL, a row decoder RDEC, a read amplifier RA, and a write amplifier WA. For example, each of the plurality of subarrays SARY corresponds to one of 32 data input/output terminals I/O0 to I/O31.

That is, the semiconductor memory device 100 is a parallel memory in which data that is read out of 32 subarrays SARY is output via 32 data input/output terminals I/O, and data received via the 32 data input/output terminals I/O is written to the 32 subarrays SARY.

The semiconductor memory device 100 may be a serial memory in which data, read out of 32 subarrays SARY, is sequentially output via one data input/output terminal I/O, and in which 32 pieces of data sequentially received via the one data input/output terminal I/O are written to respective 32 subarrays SARY. The number of subarrays SARY is not limited to 32. The number of data input/output terminals I/O in the semiconductor memory device 100 that operates as a parallel memory is not limited to 32.

Each subarray SARY includes a sense amplifier SA and a pair of memory cell arrays MCA that are arranged on both sides of the sense amplifier SA. The subarray SARY also includes bit line switches BLSW (BLSWL and BLSWR), plate line switches PLSW (PLSWL and PLSWR), and plate line control circuits PLeCNT and PLOCNT. The bit line switches BLSWL and BLSWR, the plate line switches PLSWL and PLSWR, and the plate line control circuits PLeCNT and PLOCNT will be described below with reference to FIG. 2 and subsequent drawings.

Each memory cell array MCA includes multiple memory cells MC that are each connected to a word line WL, a bit line BL, and a plate line PL. The memory cell MC includes a cell transistor CT and a ferroelectric capacitor FC. For example, the cell transistor CT is an n-metal oxide semiconductor (MOS) transistor.

A gate of the cell transistor CT is connected to the word line WL. One among a source and a drain of the cell transistor CT is connected to the bit line BL. The other among the source and the drain of the cell transistor CT is connected to a lower electrode BEL, which is one end of the ferroelectric capacitor FC. An upper electrode TEL, which is the other end of the ferroelectric capacitor FC, is connected to a plate line PL.

The control circuit CNTL receives an address signal AD and a command signal CMD, from the outside of the semiconductor memory device 100, and controls the entire operation of the semiconductor memory device 100. For example, command signals CMD include a chip enable signal/CE, a write enable signal/WE, and an output enable signal/OE. The row decoder RDEC decodes the address signal AD received via the control circuit CNTL, and drives the word line WL and the plate line PL that correspond to a value of the address signal AD at a predetermined timing.

When the control circuit CNTL receives the chip enable signal/CE having a low level, the write enable signal/WE having a high level, and the output enable signal/OE having a low level, the control circuit CNTL recognizes a read command, and then performs a read operation. In the read operation, data is read out of the memory cell MC that is selected based on the address signal AD, then the data is amplified by the sense amplifier SA, and finally outputs the amplified data to a given data input/output terminal I/O via the read amplifier RA.

When the control circuit CNTL receives the chip enable signal/CE having a low level, the write enable signal/WE having a low level, and the output enable signal/OE having a high level, the control circuit CNTL recognizes a write command, and performs a write operation. In the write operation, data received from a given data input/output terminal I/O is delivered to the sense amplifier SA via the write amplifier WA, and then the data is written to the memory cell MC that is selected based on the address signal AD. As in the read operation, in the write operation, data is read out of the memory cell MC that is selected based on the address signal AD, and then the data is amplified by the sense amplifier SA. The amplified data is rewritten to write data, and the resulting data is written to the memory cell MC.

For example, the semiconductor memory device 100 is a 2T2C type memory device in which one bit data is stored in two memory cells MC. Each memory cell MC stores data having a logical value of "0" or a logical value of "1," according to a polarization state (residual polarization value) of the ferroelectric capacitor FC. The polarization state of the ferroelectric capacitor FC changes according to a logical value of the write data. The ferroelectric capacitor FC operates as a variable capacitance capacitor whose capacitance value changes according to an electrically rewritable polarization state.

Figure 2:
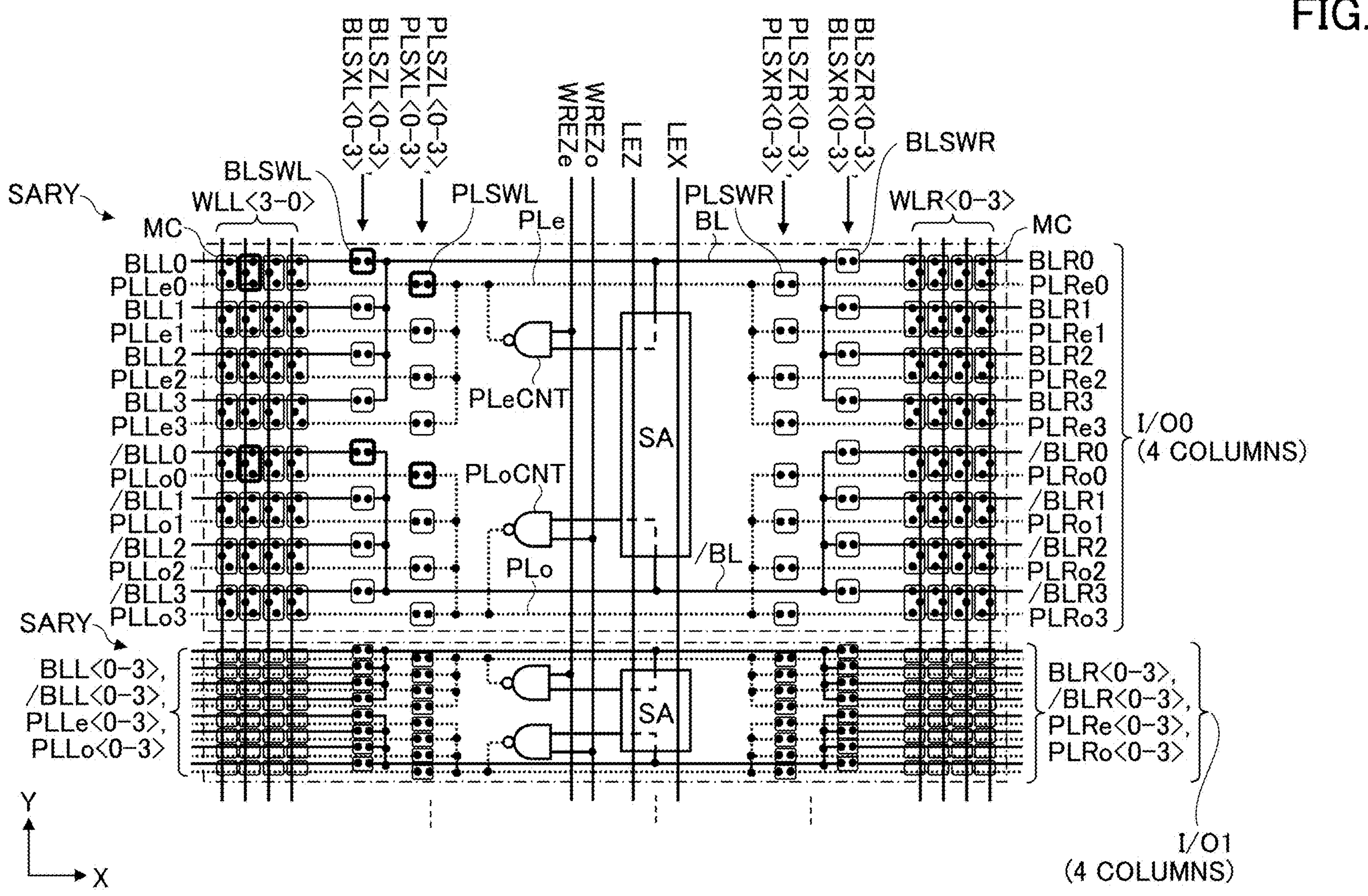
FIG. 2 is a block diagram showing a circuit example of two subarrays in FIG. 1.

FIG. 2 shows an example of a circuit of two subarrays SARY in FIG. 1. In the sense amplifier SA that is disposed substantially at a center portion of each subarray SARY, the sense amplifier SA operates during an active period of latch enable signals LEZ and LEX, and then the sense amplifier SA amplifies a difference between voltages on complementary bit lines BL and/BL. Each of the plate line control circuits PLeCNT and PLOCNT has a NAND gate. The plate line control circuit PLeCNT inverts a logic level of the bit line BL that is obtained by performing differential amplification through the sense amplifier SA, during a period in which a write enable signal WREZe is at a high level, and then the plate line control circuit PLeCNT outputs the logic level to a plate line PLe. The plate line control circuit PLeCNT outputs the write enable signal WREZe having the high level to the plate line PLe during a period in which the write enable signal WREZe is at a low level. The plate line control circuit PLeCNT is an example of one of a first restoration circuit and a second restoration circuit.

During a period in which a write enable signal WREZo is at a high level, the plate line control circuit PLOCNT inverts a logic level of the bit line/BL that is obtained by performing differential amplification through the sense amplifier SA, and outputs the resulting logic level to a plate line PLo. The plate line control circuit PLOCNT outputs the high level to the plate line PLo during a period in which the write enable signal WREZo is at a low level. The plate line control circuit PLOCNT is an example of the other circuit among a first restoration circuit and a second restoration circuit.

Each of the write enable signals WREZe and WREZo are set to the high level during a period in which data is restored (rewritten) to a given memory cell MC in the access operation of the given memory cell MC. Note that the given memory cells MC, the given bit line switches BLSW, and the given plate line switches PLSWL, as shown with thick lines indicate circuits that operate in the read operation shown in FIG. 6. In the other subarray SARY, memory cells MC, bit line switches BLSWL and BLSWR, and plate line switches PLSWL and PLSWR, which are situated at the same positions as those shown with the thick lines, are selected to operate.

One end of the bit line BL that extends in the X direction is connected to a plurality of bit lines BLL (BLL0 to BLL3) via a plurality of bit line switches BLSWL. The other end of the bit line BL is connected to a plurality of bit lines BLR (BLR0 to BLR3) via a plurality of bit line switches BLSWR. Similarly, one end of the bit line/BL that extends in the X direction is connected to a plurality of bit lines/BLL (/BLL0 to/BLL3) via a plurality of bit line switches BLSWL. The other end of the bit line/BL is connected to a plurality of bit lines/BLR (/BLR0 to/BLR3) via a plurality of bit line switches BLSWR. The bit line switch BLSWL is an example of any one among a first bit line switch and a second bit line switch. The bit line switch BLSWR is an example of the other switch among the first bit line switch and the second bit line switch.

One end of the plate line PLe that extends in the X direction is connected to a plurality of plate lines PLLe (PLLe0 to PLLe3) via a plurality of plate line switches PLSWL, respectively. The other end of the plate line PLe is connected to a plurality of plate lines PLRe (PLRe0 to PLRe3) via a plurality of plate line switches PLSWR, respectively. Similarly, one end of the plate line PLo that extends in the X direction is connected to a plurality of plate lines PLLo (PLLo0 to PLLo3) via a plurality of plate line switches PLSWL, respectively. The other end of the plate line PLo is connected to a plurality of plate lines PLRo (PLRo0 to PLRo3) via a plurality of plate line switches PLSWR, respectively. The plate line switch PLSWL is an example of one among a first plate line switch and a second plate line switch. The plate line switch PLSWR is an example of the other switch among the first plate line switch and the second plate line switch.

Here, each plate line PLLe corresponding to a given bit line BLL is disposed in parallel with the given bit line BLL. Each plate line PLLo corresponding to a given bit line/BLL is disposed in parallel with the given bit line/BLL. Each plate line PLRe corresponding to a given bit line BLR is disposed in parallel with the given bit line BLR. Each plate line PLRo corresponding to a given bit line/BLR is wired in parallel with the given bit line /BLR.

By wiring each plate line PLLe corresponding to the given bit line BLL to be in parallel with the given bit line BLL, and by wiring each plate line PLLo corresponding to the given bit line /BLL to be in parallel with the given bit line /BLL, data can be restored to the memory cell MC connected to each of the given bit lines BLL and /BLL. Similarly, by wiring each plate line PLRe corresponding to a given bit line BLR to be in parallel with the given bit line BLR, and by wiring each plate line PLRo corresponding to a given bit line /BLR to be in parallel with the given bit line /BLR, data can be restored to the memory cell MC connected to each of the given bit lines BLR and /BLR.

The bit line switch BLSWL is turned on or off using a pair of corresponding bit line selection signals BLSZL (one of BLSZL0 to BLSZL3) and BLSXL (one of BLSXL0 to BLSXL3). The bit line switch BLSWR is turned on or off using a pair of corresponding bit line selection signals BLSZR (one of BLSZR0 to BLSZR3) and BLSXR (one of BLSXR0 to BLSXR3).

For example, two bit line switches BLSW that are connected to bit lines BLL0 and /BLL0 operate in response to receiving bit line selection signals BLSZL0 and BLSXL0, respectively. Two bit line switches BLSW that are connected to the bit lines BLR2 and /BLR2 operate in response to receiving bit line selection signals BLSZR2 and BLSXR2, respectively. Bit line selection signals BLSZL, BLSXL, BLSZR, and BLSXR are wired in common with subarrays SARY arranged in the Y direction.

The plate line switch PLSWL is turned on or off in accordance with a pair of corresponding plate line selection signals PLSZL (one of PLSZL0 to PLSZL3) and PLSXL (one of PLSXL0 to PLSXL3). The plate line switch PLSWR is turned on or off in accordance with a pair of corresponding plate line selection signals PLSZR (one of PLSZR0 to PLSZR3) and PLSXR (one of PLSXR0 to PLSXR3).

For example, two plate line switches PLSWL that are connected to the plate lines PLLe0 and PLLo0 operate in response to receiving plate line selection signals PLSZL0 and PLSXL0, respectively. Two plate line switches PLSWR that are connected to the plate lines PLRe2 and PLRo2 operate in response to receiving plate line selection signals PLSZR2 and PLSXR2, respectively. The plate line selection signals PLSZL, PLSXL, PLSZR, and PLSXR are wired in common with the subarrays SARY arranged in the Y direction.

In the example shown in FIG. 2, four memory cells MC arranged in the X direction are each connected to a pair of a given bit line BLL and a given plate line PLLe that are arranged adjacently. Four memory cells MC arranged in the X direction are each connected to a pair of a given bit line /BLL and a given plate line PLLo that are arranged adjacently. Four memory cells MC arranged in the X direction are connected to a pair of a given bit line BLR and a given plate line PLRe that are arranged adjacently. Four memory cells MC arranged in the X direction are each connected to a pair of a given bit line /BLR and a given plate line PLRo that are arranged adjacently.

The number of memory cells MC arranged on each side of the subarray SARY in the X direction is not limited to four. The number of pairs of the given bit line BLL (/BLL) and the given plate line PLLe (PLLo) that are arranged adjacently is not limited to four. The number of pairs of the given bit line BLR (/BLR) and the given plate line PLRe (PLRo) that are arranged adjacently is not limited to four.

The memory cells MC arranged in the Y direction are each connected to any one among word lines WLL (WLL0 to WLL3) and word lines WLR (WLR0 to WRR3) that extend in the Y direction. The word lines WLL and WLR are wired to be shared with the subarrays SARY that are arranged in the Y direction. The number of word lines WLL and WLR that are arranged on both sides of the subarray in the X direction is not limited to four.

The bit line switch BLSWL connected to each of bit lines BLL and /BLL, and the bit line switch BLSWR connected to each of bit lines BLR and /BLR are exclusively turned on. The plate line switch PLSWL connected to each of plate lines PLLe and PLLo, and the plate line switch PLSWR connected to each of plate lines PLRe and PLRo are exclusively turned on. On periods of a given bit line switch BLSWL and a given plate line switch PLSWL overlap with each other, and on periods of a given bit line switch BLSWR and a given plate line switch PLSWR overlap with each other. In this arrangement, a pair of memory cells MC on one side or the other side of the subarray SARY in the X direction can be selected to read or write data.

In the example shown in FIG. 2, the memory cell MC that is connected to a word line WLL0, a bit line BLL0, and a plate line PLLe0 is connected to the bit line BL and the plate line PLe via a given bit line switch BLSWL and a given plate line switch PLSWL. Similarly, the memory cell MC that is connected to the word line WLL0, a bit line /BLL0, and a plate line PLLo0 is connected to the bit line /BL and the plate line PLo via a given bit line switch BLSWL and a given plate line switch PLSWL. In this arrangement, the sense amplifier SA performs differential amplification using complementary data that is stored in two memory cells MC connected to the sense amplifier SA.

With use of a given bit line switch BLSWL and a given plate line switch PLSWL, one data is read (four columns) out of two memory cells MC selected among eight memory cells MC that are connected to respective word lines WLL. Also, with use of a given bit line switch BLSWR and a given plate line switch PLSWR, the sense amplifier SA reads one data out of two memory cells MC selected among eight memory cells MC connected to respective word lines WLR (four columns).

The sense amplifier SA and the plate line control circuits PLeCNT and PLOCNT are provided to share a plurality of bit lines BLL and a plurality of bit lines BLR. In this arrangement, the number of each of sense amplifiers SA and plate line control circuits PLeCNT and PLOCNT that are mounted in the subarray SARY can be reduced, and increases in a layout size of the subarray SARY can be suppressed.

Figure 3:
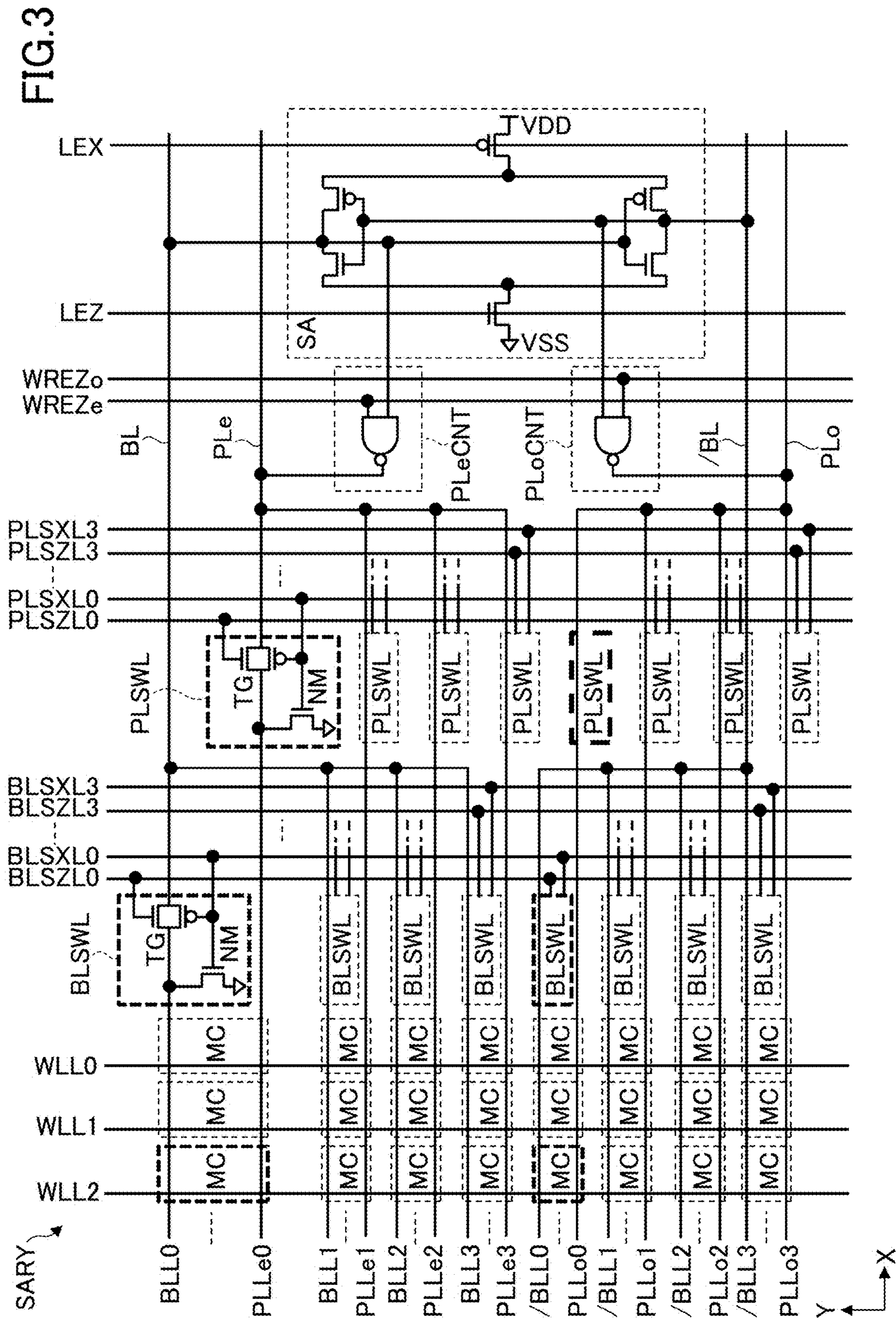
FIG. 3 is a circuit diagram showing an example of a main part of a subarray in FIG. 2.

FIG. 3 shows an example of a main part of the subarray SARY in FIG. 2. The description of the components described in FIG. 2 is omitted. FIG. 3 shows a region including the bit lines BLL0 to BLL3, the plate lines PLLe0 to PLLe3, the word lines WLL0 to WLL2, and the sense amplifier SA in FIG. 2.

The sense amplifier SA includes a complementary metal oxide semiconductor (CMOS) inverter whose input is connected to the bit line BL and whose output is connected to the bit line /BL. The sense amplifier SA also includes a CMOS inverter whose input is connected to the bit line /BL and whose output is connected to the bit line BL. A source of a p-channel MOS (metal oxide semiconductor) transistor of each CMOS inverter is connected to a power supply line VDD via a p-channel MOS transistor whose gate receives the latch enable signal LEX. A source of an n-channel MOS transistor of each CMOS inverter is connected to a ground line VSS via an n-channel MOS transistor whose gate receives the latch enable signal LEZ.

A node of the bit line BL connected to the input of the plate line control circuit PLeCNT in the sense amplifier SA is an example of one node among a first node and a second node. A node of the bit line /BL connected to the input of the plate line control circuit PLOCNT in the sense amplifier SA is an example of the other node among the first node and the second node. By transmitting, to the plate line control circuits PLeCNT and PLOCNT, a logic level of data obtained by performing differential amplification through the sense amplifier SA without using any other circuit, it is possible to suppress a long restoration period of the data to the memory cell MC.

The bit line switch BLSWL includes a CMOS transmission gate TG arranged between each bit line BLL and the bit line BL, and includes an n-channel MOS transistor NM. A circuit configuration of each of the plate line switch PLSWL and the bit line switches BLSWR and PLSWLR shown in FIG. 2 is the same as that described in the bit line switch BLSWL.

The CMOS transmission gate TG of the bit line switch BLSWL is turned on when the bit line selection signal BLSZL is at a high level and the bit line selection signal BLSXL is at a low level. The CMOS transmission gate TG of the bit line switch BLSWL is turned off when the bit line selection signal BLSZL is a low level and the bit line selection signal BLSXL is at a high level. In the n-channel MOS transistor NM of the bit line switch BLSWL, a gate receives the bit line selection signal BLSXL, a drain is connected to the bit line BLL, and a source is connected to the ground line VSS. The n-channel MOS transistor NM of the bit line switch BLSWL is turned on when the bit line selection signal BLSXL is at high level. The n-channel MOS transistor NM of the bit line switch BLSWL is turned off when the bit line selection signal BLSXL is at the low level.

The CMOS transmission gate TG of the plate line switch PLSWL is turned on when the plate line selection signal PLSZL is at the high level and the plate line selection signal PLSXL is at the low level. The CMOS transmission gate TG of the plate line switch PLSWL is turned off when the plate line selection signal PLSZL is at the low level and the plate line selection signal PLSXL is at the high level. In the n-channel MOS transistor NM of the plate line switch PLSWL, a gate receives the plate line selection signal PLSXL, a drain is connected to the plate line PLLe, and a source is connected to the ground line VSS. The n-channel MOS transistor NM of the plate line switch PLSWL is turned on when the plate line selection signal PLSXL is at the high level. The n-channel MOS transistor NM of the plate line switch PLSWL is turned off when the plate line selection signal PLSXL is at the low level.

Figure 4:
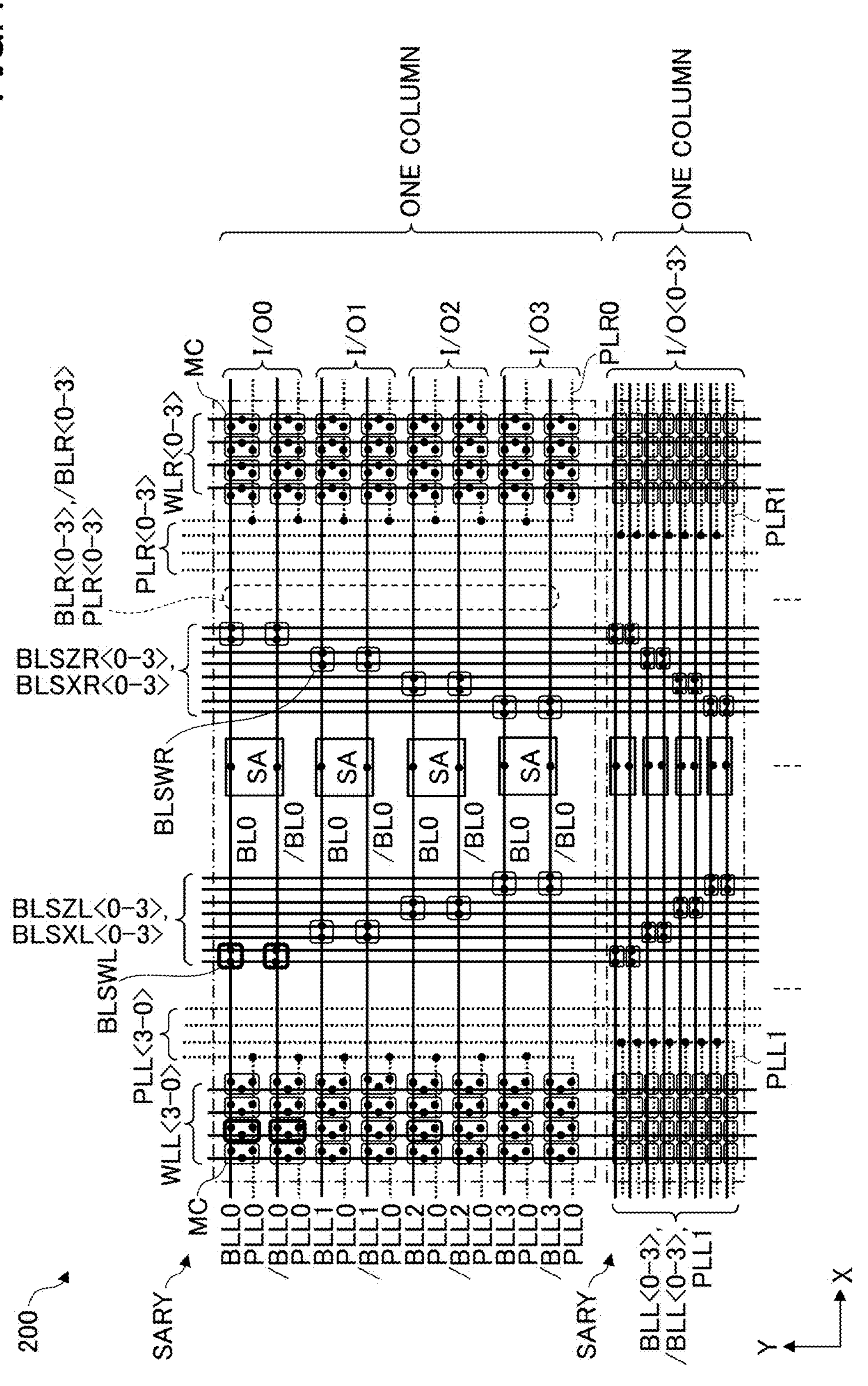
FIG. 4 is a block diagram showing a circuit example of two subarrays of another semiconductor memory device.

FIG. 4 shows an example of a circuit of two subarrays in another semiconductor memory device. A semiconductor memory device 200 shown in FIG. 4 is a 2T2C type device. Each subarray SARY uses four data input/output terminals I/O0 to I/O3, and one column is adopted. Four pieces of data corresponding to four data input/output terminals I/O are read and/or written for each subarray SAR. The subarray SARY includes four sense amplifiers SA. The four sense amplifiers SA are connected to respective bit line pairs BL (one of BL0 to BL3) and /BL (one of /BL0 to /BL3).

Each bit line BL is connected to a given bit line BLL (one of BLL0 to BLL3) via a given bit line switch BLSWL, and each bit line /BL is connected to a given bit line BLL (one of /BLL0 to /BLL3) via a given bit line switch BLSWL. Each of the bit line BL is connected to a given bit line BLR (one of BLR0 to BLR3) via a given bit line switch BLSWR, and each of the bit line BL is connected to a given bit line /BLR (one of /BLR0 to /BLR3) via a given bit line switch BLSWR. Note that the memory cells MC and the bit line switches BLSWL as shown with thick lines indicate circuits that operate in the read operation of the semiconductor memory device 200 shown in FIG. 7.

Figure 5:
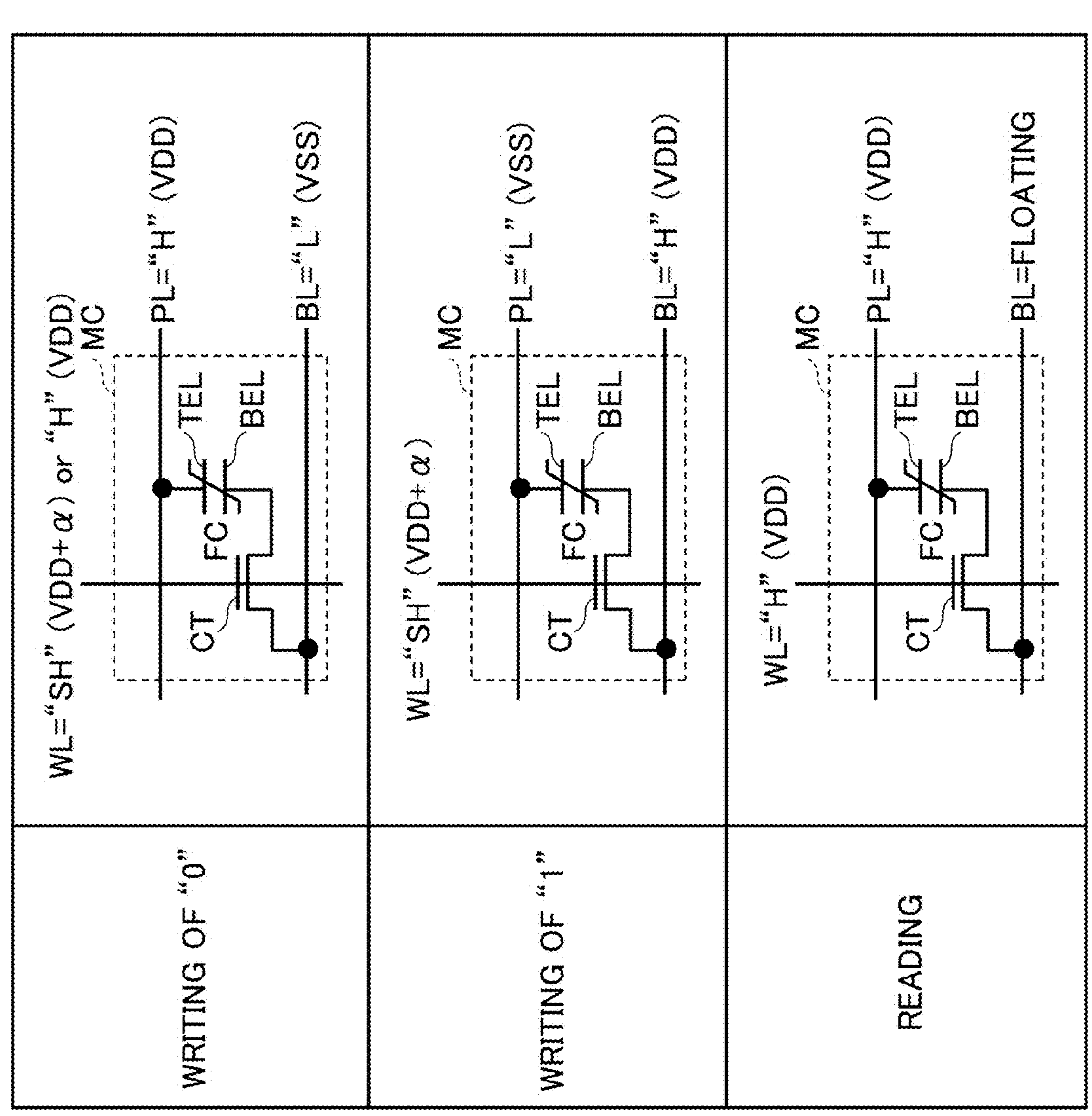
FIG. 5 is a diagram for describing an example of a write operation and a read operation of a ferroelectric capacitor in FIG. 1.

FIG. 5 shows an example of the write operation and the read operation of the ferroelectric capacitor FC shown in FIG. 1. In an "0" write operation of the ferroelectric capacitor FC, the word line WL is set to a high level SH that is higher than the power supply voltage VDD, the plate line PL is set to a high level H (=VDD), and the bit line BL is set to a low level L (VSS).

In this arrangement, when no voltage is applied between the upper electrode TEL and the lower electrode BEL after performing the "0" write operation, a remanent polarization value of the ferroelectric capacitor FC is set to be greater than that obtained when "1" is stored in the ferroelectric capacitor FC, and the ferroelectric capacitor FC stores "0." In the "0" write operation of the ferroelectric capacitor FC, the word line WL may be set to the power supply voltage VDD because it is sufficient when the low level of the bit line BL is transmitted to the lower electrode BEL.

In the "1" write operation of the ferroelectric capacitor FC, the word line WL is set to the high level SH that is higher than the power supply voltage VDD, the plate line PL is set to the low level L (=VSS), and the bit line BL is set to the high level H (VDD). In this arrangement, when no voltage is applied across the upper electrode TEL and the lower electrode BEL after performing the "1" write operation, the remanent polarization value of the ferroelectric capacitor FC is set to be less than that obtained when "0" is stored in the ferroelectric capacitor FC, and the ferroelectric capacitor FC stores "1."

In the read operation of the ferroelectric capacitor FC, the word line WL is set to the high level (VDD), and the plate line PL is set to the high level L (=VDD) in a state in which the bit line BL is set to an electrically floating state. A voltage corresponding to the remanent polarization value of the ferroelectric capacitor FC is generated at the bit line BL.

In the 2T2C type ferroelectric memory, "0" or "1" is read out by a given sense amplifier SA amplifying a difference between the voltage of the bit line BL connected to the memory cell MC that stores "0," and the voltage of the bit line BL connected to the memory cell MC that stores "1." In the ferroelectric memory of the 1T1C type, "0" or "1" is read out by a given sense amplifier SA amplifying a difference between the voltage of the bit line BL connected to the memory cell MC that stores "0" or "1," and the voltage of the bit line BL connected to the reference cell. In the reference cell, an intermediate residual polarization value of a residual polarization value corresponding to "0" and a residual polarization value corresponding to "1" is stored in advance.

Figure 6:
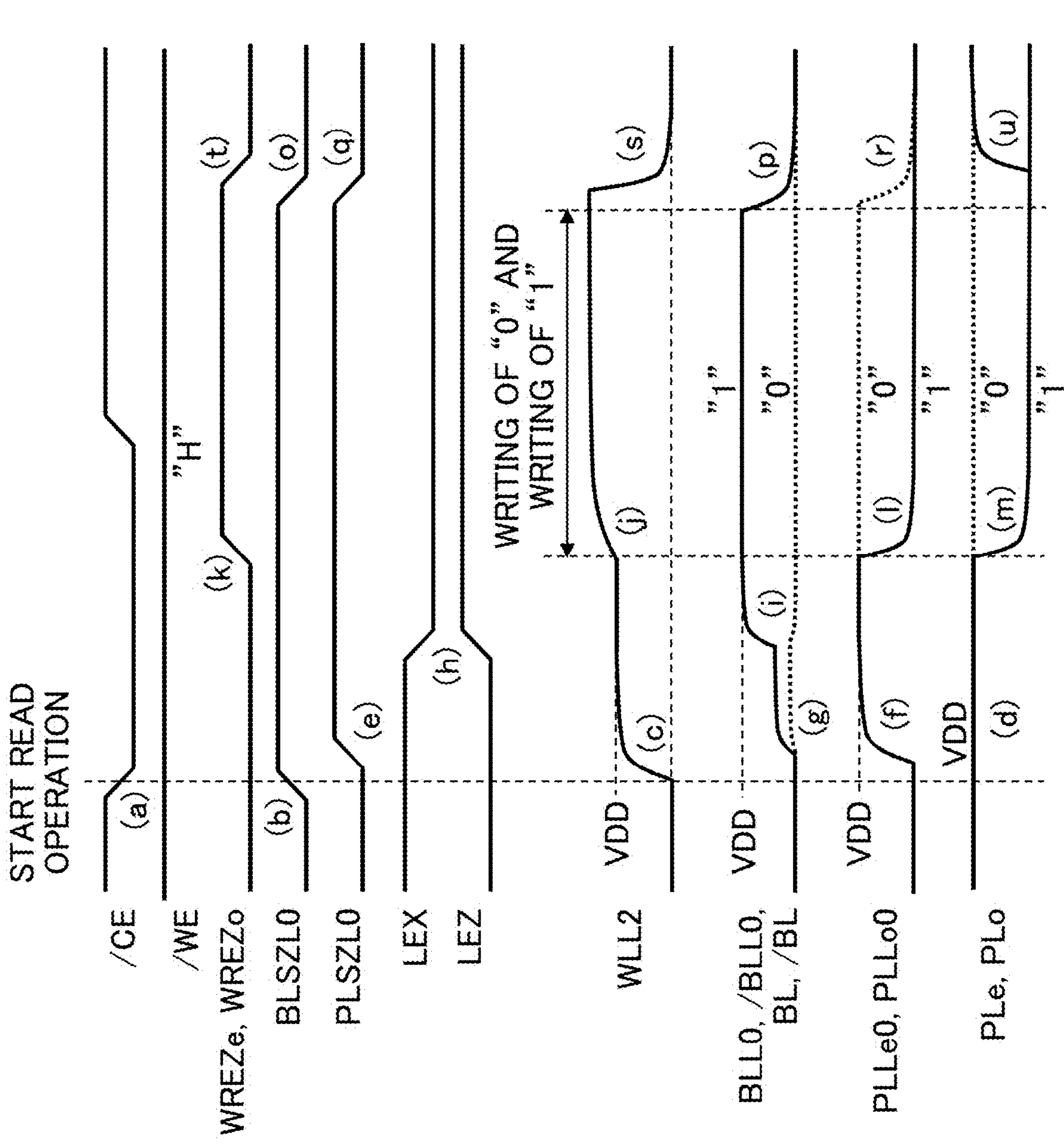
FIG. 6 is a timing chart showing an example of an access operation of the semiconductor memory device in FIG. 1.

FIG. 6 shows an example of the access operation of the semiconductor memory device 100 in FIG. 1. In FIG. 6, a predetermined address signal AD (not shown) is delivered, and the read operation is performed ((a) of FIG. 6) when a chip enable signal /CE changes to the low level in a state where the write enable signal /WE is at the high level H.

The address signal AD (not shown) is decoded, the bit line selection signal BLSZL0 corresponding to the address signal AD is set to the high level, and a word line WLL2 corresponding to the address signal AD is set to the high level (=VDD) ((b) and (c) of FIG. 6). The bit line selection signal BLSXL0 is set to an opposite level with respect to the bit line selection signal BLSZL0. During a period in which write enable signals WREZe and WREZo are at the low level, the plate lines PLe and PLO are set to the high level (=VDD) in accordance with the high level output from the plate line control circuits PLeCNT and PLOCNT ((d) of FIG. 6).

Next, the plate line selection signal PLSZL0 corresponding to the address signal AD is set to the high level, and a corresponding plate line switch PLSWL is turned on ((e) of FIG. 6). The high level of the plate lines PLe and PLo is transmitted to the plate lines PLLe0 and PLLo0, respectively, via the plate line switch PLSWL that is turned on, and as a result, the plate lines PLLe0 and PLLo0 are set to the high level (=VDD) ((f) of FIG. 6). The plate line selection signal PLSXL0 is set to an opposite level with respect to the plate line selection signal PLSZL0.

The data is read out of a pair of memory cells MC, to the bit lines BLL0 and /BLL0 in accordance with the high level of the plate lines PLLe and PLLo. Then, voltages of the bit lines BLL0 and /BLL0 rise in accordance with the data "1" (solid line) or the data "0" (dotted line) that are stored in the memory cell MC ((g) of FIG. 6). The voltages of the bit lines BLL0 and /BLL0 are transmitted to the bit lines BL and /BL via the bit line switch BLSWL that is turned on.

In the following, for the sake of simplicity, it is assumed that the data "0" is stored in the memory cell MC connected to the bit line BLL0 and the plate line PLLe0, and the data "1" is stored in the memory cell MC connected to the bit line /BLL0 and the plate line PLLo0.

Next, the latch enable signals LEZ and LEX are activated to the high level and the low level, respectively, and the sense amplifier SA operates ((h) of FIG. 6). The sense amplifier SA amplifies a voltage difference between the bit lines BL and /BL, sets the bit line BL to the high level ("1"), and sets the bit line /BL to the low level ("0") ((i) of FIG. 6).

Next, the word line WLL2 is set to a voltage that is higher than the power supply voltage VDD ((j) of FIG. 6. Further, the write enable signals WREZe and WREZO are set to the high level, and the plate line control circuits PLeCNT and PLOCNT are activated ((k) of FIG. 6). As a result, the plate lines PLe (PLLe) and PLO (PLLo) are set to voltage levels that are obtained by inverting voltage levels of the bit lines BLL (BLL0) and /BL (/BLL0) ((l) and (m) of FIG. 6). For example, the plate line PLLe0 is set to "1" (solid line), and the plate line PLLo0 is set to "0" (dotted line).

In this arrangement, the bit line BLL0 and the plate line PLLe0 that are connected to the memory cell MC storing the data "0" are set to the low level ("0") and the high level ("1"), respectively, and the data "0" is restored to the memory cell MC. When the data "1" is stored in the memory cell MC, the bit line /BLL0 and the plate line PLLo0 are set to the high level ("1") and the low level ("0"), respectively, and the data "1" is restored to the memory cell MC. As a result, complementary data stored in a given pair of memory cells MC can be restored at the same timing. Thus, a cycle time period upon accessing the memory can be reduced, and a random access can be performed at a high speed.

Thereafter, the bit line selection signal BLSZL0 and the bit line selection signal BLSXL0 (not shown) are set to the low level and the high level, respectively, and the n-channel MOS transistor NM of the bit line switch BLSWL is turned on ((o) of FIG. 6). As a result, the bit lines BLL0 and /BLL0 are set to the low level ((p) of FIG. 6). Also, the plate line selection signal PLSZL0 and the plate line selection signal PLSXL0 (not shown) are set to the low level and the high level, respectively, and the n-channel MOS transistor NM of the plate line switch PLSWL is turned on ((q) of FIG. 6). As a result, the plate lines PLLe0 and PLLo0 are set to the low level ((r) of FIG. 6).

Then, the word line WLL2 is set to the low level, and the write enable signals WREZe and WREZo are set to the low level ((s) and (t) of FIG. 6). The plate lines PLLe and PLLo are set to the high level (=VDD) in accordance with the low level of the write enable signals WREZe and WREZO ((u) of FIG. 6). Then, the read operation is completely performed. The write operation of the semiconductor memory device 100 is the same as the read operation except that both a given voltage level corresponding to write data that is received at the data input/output terminal I/O, and an opposite level of the given voltage level are applied to the bit lines BL and /BL, respectively. Both a voltage level corresponding to the write data and an opposite level of the given voltage level are applied to the bit lines BL and /BL, respectively, during a period in which writing of "0" and writing of "1" are performed for restoring data to the memory cell MC.

Figure 7:
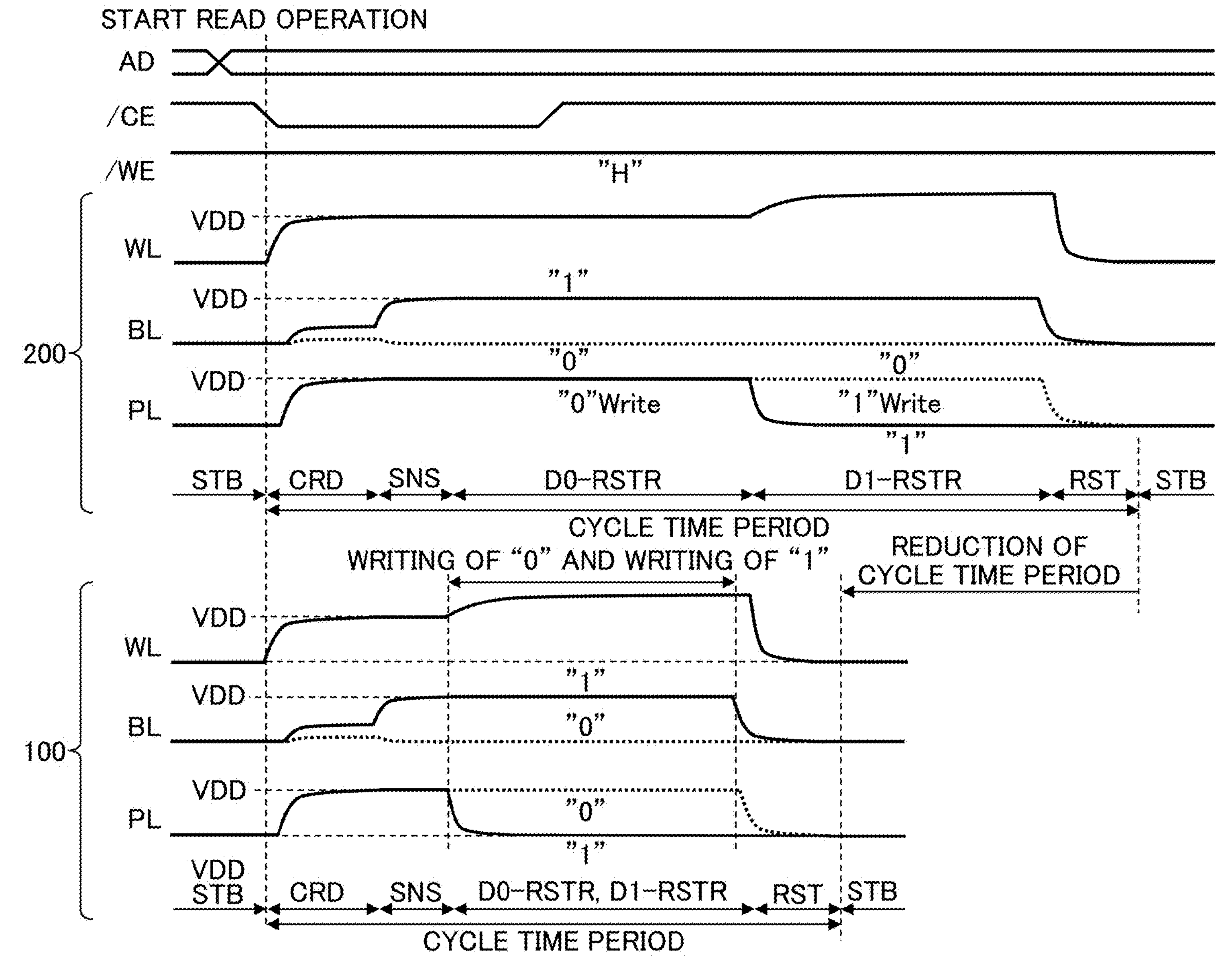
FIG. 7 is a timing chart showing a difference between access operations of the semiconductor memory devices in FIGS. 1 and 4.

FIG. 7 shows a difference between access operations of the semiconductor memory devices shown in FIGS. 1 and 4. In FIG. 7, the read operation is performed in the same manner as in FIG. 6. The read operation of the semiconductor memory device 100 is the same as described in FIG. 6. However, a waveform on the plate line PL of the semiconductor memory device 100 indicates a waveform on a plate line (for example, PLLe0) connected to the memory cell MC.

In FIG. 7, STB expresses a standby period, and CRD expresses a cell read period during which data is read out of the memory cell MC. SNS expresses a sense period of the sense amplifier SA. D0-RSTR expresses a restoration period of the data "0," and D1-RSTR expresses a restoration period of the data "1." RST expresses a reset period.

In the semiconductor memory device 100, the restoration period D1-RSTR overlaps with the restoration period D0-RSTR. In contrast, in the read operation of the semiconductor memory device 200, the restoration period D1-RSTR is obtained after the restoration period D0-RSTR. With this approach, a cycle time period for the read operation of the semiconductor memory device 100 can be reduced by the restoration period D1-RSTR from the cycle time period of the read operation of the semiconductor memory device 200. Note that, as in the read operation, a cycle time period of the write operation of the semiconductor memory device 100 can be reduced by the restoration period D1-RSTR from the cycle time period of the write operation of the semiconductor memory device 200.

Figure 8:
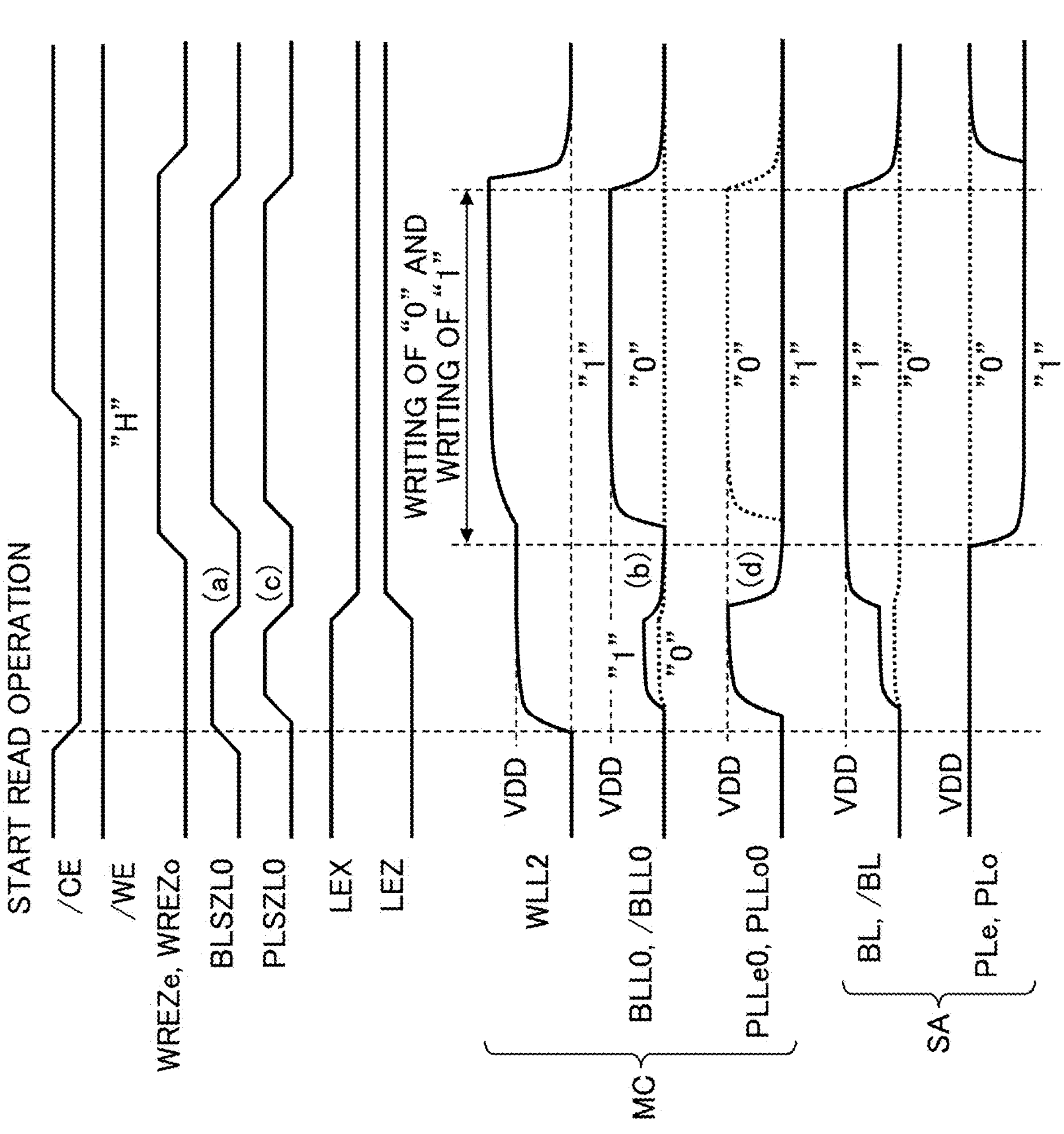
FIG. 8 is a timing chart showing another example of the access operation of the semiconductor memory device in FIG. 1.

FIG. 8 shows another example of the access operation of the semiconductor memory device 100 in FIG. 1. In FIG. 8, the read operation is performed. In this description, in FIG. 8, the bit line selection signal BLSZL0 that is activated before amplifying data by the sense amplifier SA is temporarily inactivated, and thus the bit line switch BLSWL is turned off. As a result, the bit lines BLL0 and /BLL0 are set to the low level (FIG. 8 (a) and (b)). Then, the sense amplifier SA performs an amplification operation in a state where the bit lines BLL0 and /BLL0 are disconnected from the sense amplifier SA, and thus the read operation is performed (confined sense system).

In the confined sense system, the capacitance of the bit lines BLL0 and /BLL0 is not recognized by the sense amplifier SA, and thus the amplification operation of the sense amplifier SA can be performed at a higher speed than in a case where the confined sense system is not employed.

Further, in FIG. 8, by temporarily inactivating the plate line selection signal PLSZL0 and turning off a given plate line switch PLSWL, the plate lines PLLe0 and PLLo0 are set to the low level during the confined sense ((c) and (d) of FIG. 8). That is, in the confined sense system, both the bit lines BLL0 and /BLL0 and the plate lines PLLe0 and PLLo0 are set to the low level before restoring data.

With this arrangement, when restoring the data to a given memory cell MC, only one of the upper electrode TEL and the lower electrode BEL (That is, only one of the plate line PLL and the bit line BLL) of the ferroelectric capacitor FC can change from the low level to the high level. Therefore, the restoration period can be reduced as compared with a case where the voltage across the upper electrode TEL and the lower electrode BEL changes.

As described above, in the present embodiment, the plate line control circuits PLeCNT and PLOCNT respectively provide levels obtained by inverting levels of the bit lines BL and /BL, to the plate lines PLe and PLO. In this arrangement, writing of "1" and writing of "0" can be performed at the same timing when restoring a given memory cell MC. As a result, the cycle time period upon accessing the memory can be reduced, and a random access can be performed at a high speed.

By turning off the bit line switch BLSWL before amplifying the data by the sense amplifier SA, the capacitance of the bit line BLL0 and /BLL0 can be made invisible from the sense amplifier SA during amplification that is performed by the sense amplifier SA, and an amplification operation can be performed at a high speed. Furthermore, by turning off the plate line switch PLSWL in conjunction with turning off the bit line switch BLSWL, only one of the upper electrode TEL and the lower electrode BEL of the ferroelectric capacitor FC can change from a low level to a high level when restoring the data. Therefore, a restoration period can be reduced as compared with a case where the voltage across the upper electrode TEL and the lower electrode BEL changes.

By transmitting, to the plate line control circuits PLeCNT and PLOCNT, the logic level of data that is obtained by performing differential amplification through the sense amplifier SA without using any other circuit, it is possible to suppress increases in the restoration period of the data to the memory cell MC. By wiring the bit lines BLL, /BLL, BLR, and /BLR to be in parallel with the respective plate lines PLLe, PLLo, PLRe, and PLRo, data can be restored for each memory cell MC.

By providing the sense amplifier SA and the plate line control circuits PLeCNT and PLOCNT that share a plurality of bit lines BLL and BLR, the number of each of sense amplifiers SA and plate line control circuits PLeCNT and PLOCNT that are mounted on the subarray SARY can be reduced. As a result, increases in a layout size of the subarray SARY can be suppressed.

Figure 9:
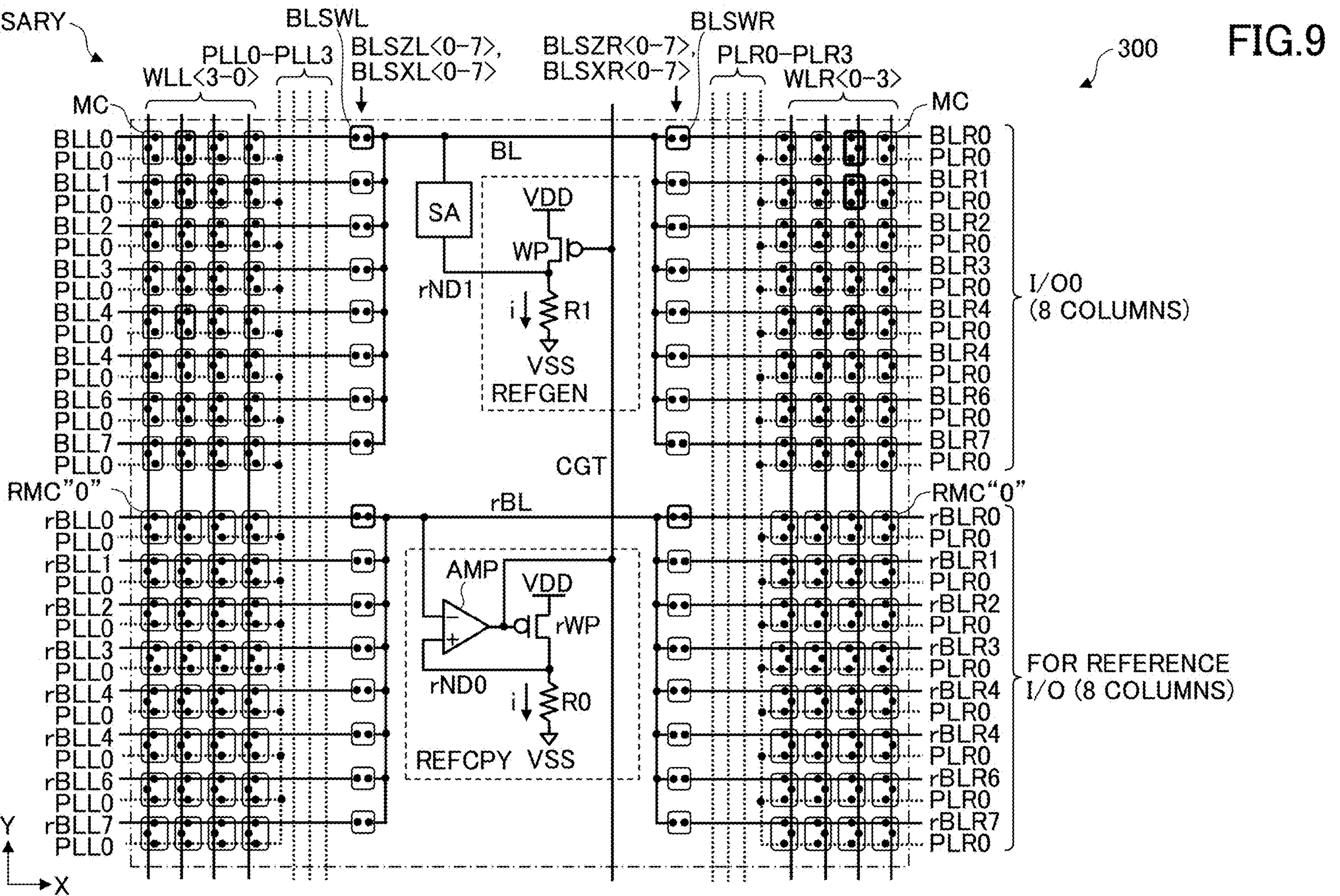
FIG. 9 is a block diagram showing an example of a main part of yet another semiconductor memory device.

FIG. 9 shows an example of a main part of another semiconductor memory device. A semiconductor memory device 300 shown in FIG. 9 is a 1T1C type device in which one bit data is stored in one memory cell MC, and a reference cell RMC is used for reading data from the memory cell MC. In the following description, it is assumed that the components shown in FIG. 9 are included in one subarray SARY.

The subarray SARY has the same number of memory cells MC as the number of memory cells MC included in the subarray SARY in FIG. 4, and has the same number of reference cells RMC as the number of memory cells MC. By providing the same number of reference cells RMC as the number of memory cells MC, a number of times that each reference cell RMC is accessed, and a number of times that a corresponding memory cell MC is accessed can be equal to each other. With this arrangement, a difference in a characteristic variation between the reference cell RMC and the memory cell MC, due to the number of accesses can be reduced The size of the ferroelectric capacitor FC in each reference cell RMC is set to be larger than the size of the ferroelectric capacitor FC in each memory cell MC. Each reference cell RMC constantly holds data "0." Thus, the remanent polarization value of the ferroelectric capacitor FC in each reference cell RMC can be set to an intermediate value of a remanent polarization value FC of the data “0,” and a remanent polarization value of the data “1,” which are obtained for each memory cell MC.

Each memory cell MC that is arranged on the right side of FIG. 9 is connected to one among bit lines BLL (BLL0 to BLL7); one among word lines WLL (WLL0 to WLL3); and the plate line PLLo. Each reference cell RMC that is arranged on the left side of FIG. 9 is connected to one among reference bit lines rBLL (rBLL0 to rBLL7); one among word lines WLL (WLL0 to WLL3); and the plate line PLLo.

Each memory cell MC that is arranged on the right side of FIG. 9 is connected to one among bit lines BLR (BLR0 to BLR7); one among word lines WLR (WLR0 to WLR3); and the plate line PLR0. Each reference cell RMC that is arranged on the right side of FIG. 9 is connected to one among reference bit lines rBLR (rBLR0 to rBLR7); one among word line WLR (WLR0 to WLR3); and the plate line PLR0.

Each bit line BLL is connected to the bit line BL via a given bit line switch BLSWL. Each bit line BLR is connected to the bit line BL via a given bit line switch BLSWR. The sense amplifier SA includes the same circuit as the sense amplifier SA shown in FIG. 3. The sense amplifier SA is connected to the bit line BL and a reference node rND1. The sense amplifier SA determines data that is stored in the memory cell MC to be accessed, by amplifying a voltage difference between the bit line BL and reference node rND1.

The reference node rND1 is connected to a reference generation circuit FEFGEN. The reference generation circuit FEFGEN includes, for example, a p-channel MOS transistor WP and a resistive element R1 that are connected in series between the power supply line VDD and the ground line VSS. In the p-channel MOS transistor WP, a gate is connected to a common gate line CGT, a source is connected to the power supply line VDD, and a drain is connected to the sense amplifier SA via the reference node rND1.

Each reference bit line rBLL is connected to the reference bit line rBL via a given bit line switch BLSWL. Each reference bit line rBLR is connected to the reference bit line rBL via a given bit line switch BLSWR. The reference bit line rBL is connected to a reference copy circuit REFCPY.

The reference copy circuit REFCPY includes, for example, a p-channel MOS transistor rWP and a resistive element R0 that are connected in series between the power supply line VDD and the ground line VSS, and includes a preamplifier AMP. In the p-channel MOS transistor rWP, a gate is connected to the common gate line CGT and an output of the preamplifier AMP, a source is connected to the power supply line VDD, and a drain is connected to a + input of the preamplifier AMP via a reference node rND0.

The preamplifier AMP outputs a control voltage to the common gate line CGT and the gate of the p-channel MOS transistor rWP, in accordance with a difference between a voltage of the reference bit line rBL applied to the—input and a voltage at the reference node rND0. The p-channel MOS transistors WP and rWP whose gates are connected to the common gate line CGT, and the resistive elements R1 and R0 function as a current mirror circuit, and a current i flowing through the resistive element R0 is copied to a current i that flows through the resistive element R1. Thus, a reference voltage that is read out of one of a plurality of reference cells RMC to the reference bit line rBL can be copied at the reference node rND1. Then, the sense amplifier SA can determine a logical value of the data stored in the memory cell MC by amplifying a difference between a voltage magnitude of the data that is read out of the memory cell MC to the bit line BL, and a voltage magnitude (reference level) at the reference node rND1.

In an approach to generate the reference voltage using the current mirror circuit shown in FIG. 9, it is necessary to design the preamplifier AMP with high accuracy in order to increase generation accuracy of the reference level, and a feedback control by the preamplifier AMP is required. In this case, generation of the reference level takes time, which may hinder the acceleration of the random access by the semiconductor memory device 300. Further, when the same number of reference cells RMC as the number of memory cells MC are mounted on the semiconductor memory device 300, there is a problem that a chip area of the semiconductor memory device 300 increases, which may result in an increased cost.

Figure 10:
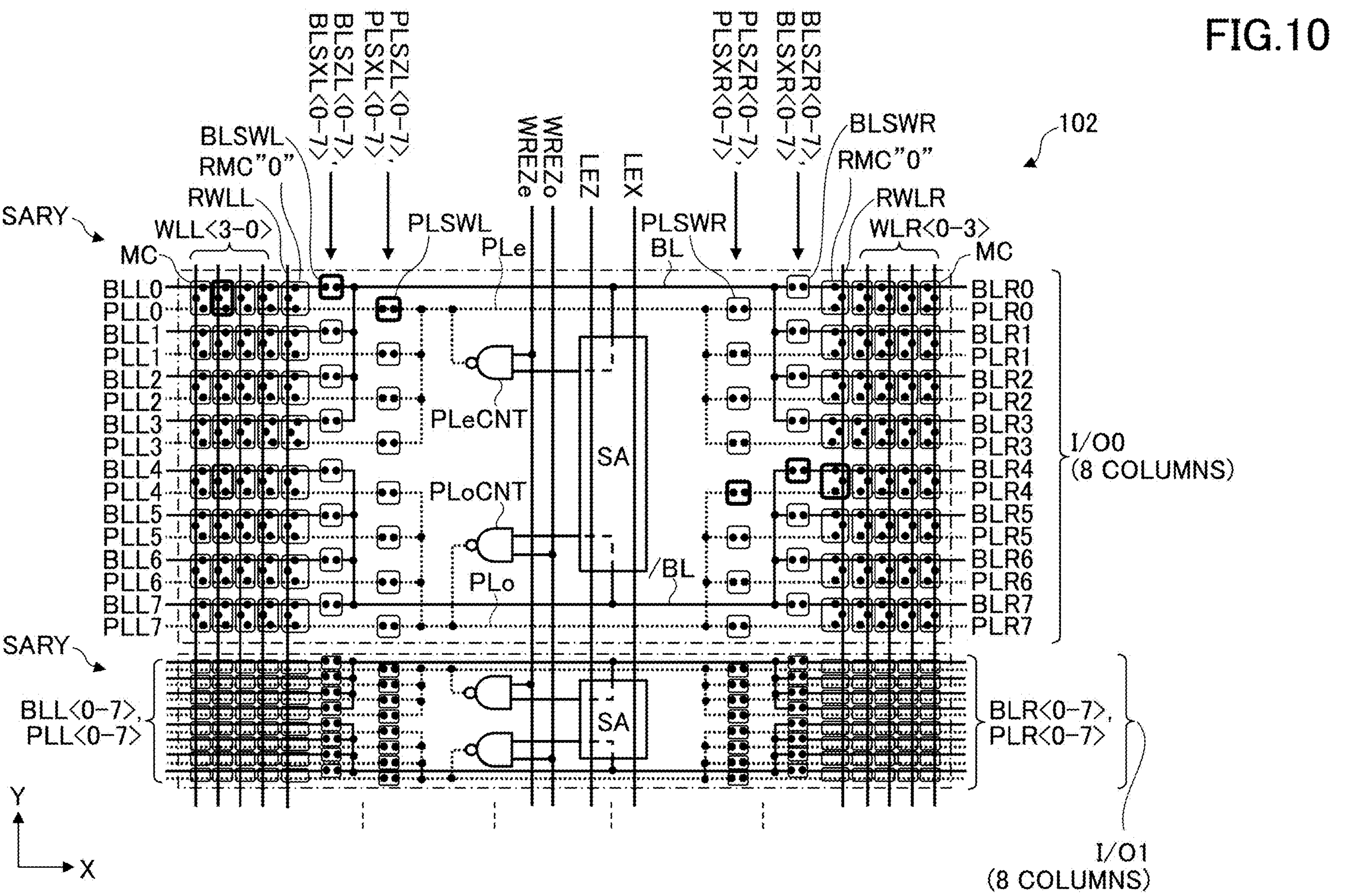
FIG. 10 is a block diagram showing a circuit example of two subarrays of the semiconductor memory device according to another embodiment.

FIG. 10 shows an example of the circuit of two subarrays in the semiconductor memory device according to another embodiment. The detailed description of the same components as described in FIGS. 2 and 3 is omitted. For example, as in the semiconductor memory device 100 shown in FIG. 1, a semiconductor memory device 102 shown in FIG. 10 includes a plurality of subarrays SARY, a control circuit CNTL, a row decoder RDEC, a read amplifier RA, and a write amplifier WA. The semiconductor memory device 102 is mounted in each of various electronic devices as a single memory device.

The semiconductor memory device 102 shown in FIG. 10 is a 1T1C type device. The semiconductor memory device 102 includes reference cells RMC arranged in a row along the Y direction on a sense amplifier SA-side of a region of memory cells MC that are arranged on each of a negative X side and a positive X side of FIG. 10. As in described in FIG. 9, each reference cell RMC constantly holds data “0.” In the semiconductor memory device 102 of the 1T1C type, without using a complementary bit line, single bit lines BLL (BLL0 to BLL7) and single bit lines BLR (BLR0 to BLR7) are adopted. Also, without using a pair of plate lines, single plate lines PLL (PLLo to PLL7) and PLR (PLR0 to PLR7) are adopted.

In the 1T1C type device, one memory cell MC and one reference cell RMC are selected for each subarray SARY when accessing the memory cell MC. In this arrangement, eight bit line switches BLSWL on the left X side of the sense amplifier SA individually operate in response to eight pairs of bit line selection signals, among BLSZL0 to BLSZL7 and BLSXL0 to BLSXL7. The eight bit line switches BLSWR on the right side of the sense amplifier SA individually operate in response to eight pairs of bit line selection signals, among BLSZR0 to BLSZR7 and BLSXR0 to BLSXR7.

For example, when a given memory cell MC shown by a thick line on the left side of FIG. 10 is accessed, a given reference cell RMC shown by a thick line on the right side of FIG. 10 is selected. That is, when a specific memory cell MC is accessed, the reference cell RMC located on an opposite side of the sense amplifier SA from the accessed specific memory cell MC is selected.

The bit line BLL0 connected to an accessed memory cell MC is connected to the bit line BL via a given bit line switch BLSWL (thick line) that is turned on by activating bit line selection signals BLSZL0 and BLSXL0. The plate line PLLo connected to an accessed memory cell MC is connected to the plate line PLe via a given plate line switch PLSWL (thick line) that is turned on by activating plate line selection signals PLSZL0 and PLSXL0.

The bit line BLR4 connected to an accessed reference cell RMC is connected to the bit line /BL via a given bit line switch BLSWR (thick line) that is turned on by activating bit line selection signals BLSZR4 and BLSXR4. The plate line PLR4 connected to an accessed reference cell RMC to be accessed is connected to the plate line PLo via a given plate line switch PLSWR (thick line) that is turned on by activating plate line selection signals PLSZR4 and PLSXR4. In the other subarray SARY, a given memory cell MC, a given reference cell RMC, the bit line switches BLSWL and BLSWR, and the plate line switches PLSWL and PLSWR, as disposed at positions corresponding to the positions indicated by the above thick lines, are selected to operate.

A circuit configuration of each of the sense amplifier SA and the plate line control circuits PLeCNT and PLOCNT is the same as described in each of the sense amplifier SA and the plate line control circuits PLeCNT and PLOCNT of the 2T2C type semiconductor memory device 100 shown in FIGS. 2 and 3. In this arrangement, in the semiconductor memory device 102, the sense amplifier SA can operate at a higher speed than a case where the reference copy circuit REFCPY and the reference generation circuit FEFGEN shown in FIG. 9 are used. Further, the same circuit as described in the semiconductor memory device 100 shown in FIG. 2 can be used, and as a result, design assets are applicable, and increases in a development cost of the semiconductor memory device 102 can be suppressed.

A pair of memory cells MC may be connected to bit lines BL and /BL and plate lines PLe and PLo by simultaneously selecting (i) one pair of given plate line selection signals PLSZL <one of 0 to 3> and PLSXL <one of 0 to 3>; (ii) one pair of corresponding bit line selection signals BLSZL <one of 0 to 3> and BLSXL <one of 0 to 3>; (iii) one pair of given plate line selection signals PLSZL <one of 4 to 7> and PLSXL <one of 4 to 7>; and (iv) one pair of corresponding bit line selection signals <one of BLSZLs 4 to 7> and BLSXL <one of BLSXLs 4 to 7>. Alternatively, a pair of memory cells MC may be connected to bit lines BL and /BL and plate lines PLe and PLo by simultaneously selecting (i) one pair of plate line selection signals PLSZR <one of 0 to 3> and PLSXR <one of 0 to 3>; (ii) one pair of corresponding bit line selection signals BLSZR <one of 0 to 3> and BLSXR <one of 0 to 3>; (iii) one pair of given plate line selection signals PLSZR <one of 4 to 7> and PLSXR <one of 4-7>; and (iv) one pair of corresponding bit line selection signals BLSZR <one of 4 to 7> and BLSXR <one of 4 to7>. In the arrangement, the semiconductor memory device 102 can operate as a 2T2C type device, similarly to the subarray SARY shown in FIG. 2.

Figure 11:
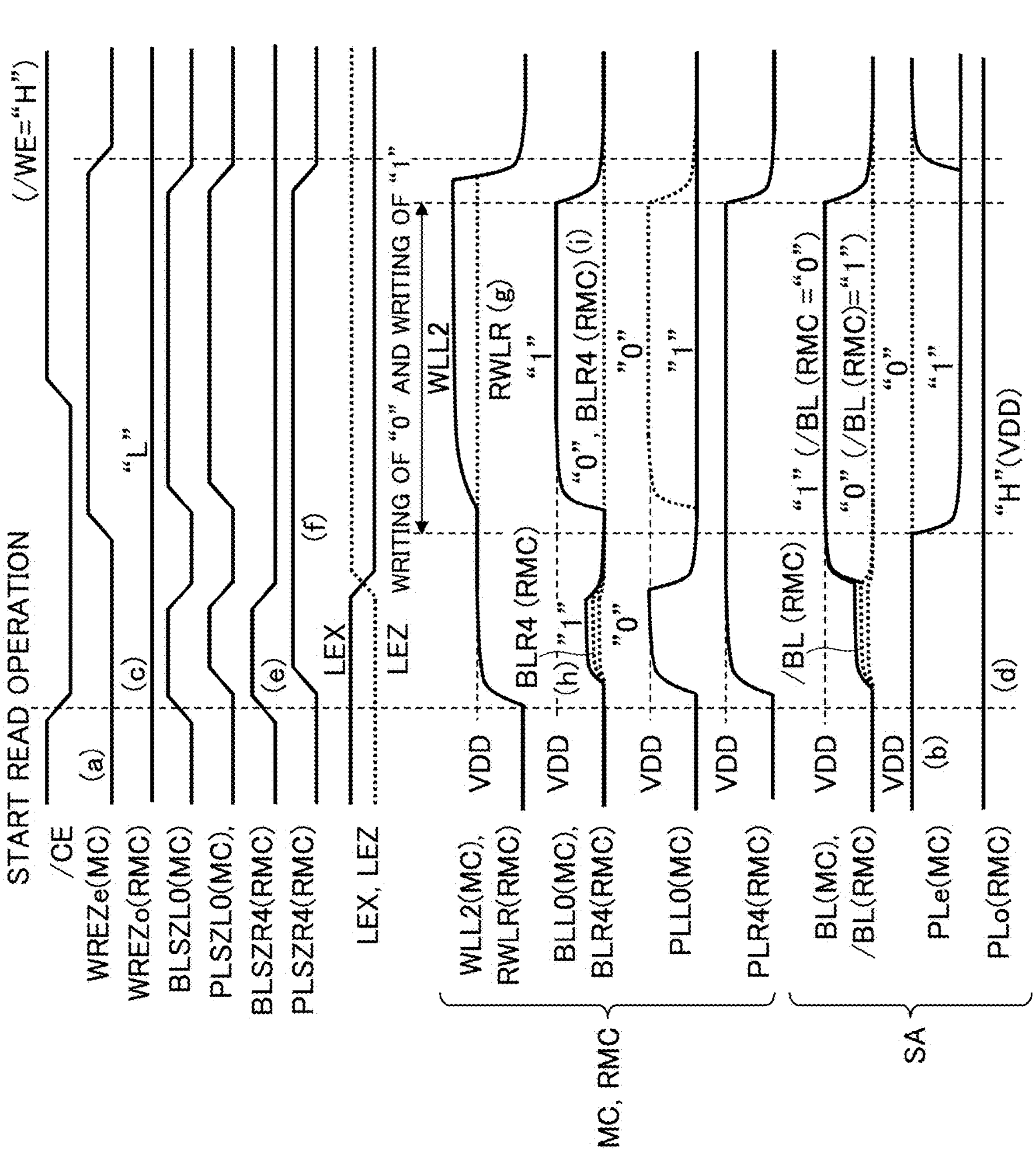
FIG. 11 is a timing chart showing an example of the access operation of the semiconductor memory device that includes the subarrays in FIG. 10.

FIG. 11 shows an example of the access operation of the semiconductor memory device 102 shown in FIG. 10. The detailed description of the operation similar to that described in FIG. 8 is omitted. In FIG. 11, the read operation is performed, and waveforms of the chip enable signal /CE and the latch enable signals LEZ and LEX are the same as those described in FIG. 8. In the read operation, the write enable signal /WE is constantly set to the high level "H."

The waveforms of the bit line selection signal BLSZL0 and the plate line selection signal PLSZL0 are the same as those described in FIG. 8. That is, the semiconductor memory device 102 adopts a confined sense system in which the sense amplifier SA performs the amplification operation in a state where the bit lines BLL connected to the memory cells MC and the bit lines BLR connected to the reference cells RMC are separated from the sense amplifier SA.

The waveform of the write enable signal WREZe that corresponds to the plate line PLe connected to an accessed memory cell MC, and the waveform on the plate line PLe are the same as those shown in FIG. 8 ((a) and (b) of FIG. 11). The write enable signal WREZo that corresponds to the plate line PLo connected to an accessed reference cell RMC is set to a low level "L" ((c) of FIG. 11).

In accordance with the low level of the write enable signal WREZo, the plate line PLo corresponding to an accessed reference cell RMC is set to a high level "H" ((d) of FIG. 11). This can prevent the accessed reference cell RMC from being rewritten to "1."

When the memory cell MC corresponding to the bit line /BL is accessed, the write enable signal WREZe is set to low level "L," and as a result, the write enable signal WREZo has the same waveform as the write enable signal WREZe in FIG. 11.

The bit line selection signal BLSZR4 corresponding to the accessed reference cell RMC is set to high level during a period in which data is read out of the reference cell RMC to the bit line /BL, and then is set to the low level ((e) of FIG. 11). The plate line selection signal PLSZR4 corresponding to the accessed reference cell RMC is set to the high level with respect to a rising edge of the plate line selection signal PLSZL0 that corresponds to the accessed memory cell MC until a restoration period ends ((f) of FIG. 11).

Waveforms for the word line WLL2, the bit line BLL0, and the plate line PLLE0 that are connected to an accessed memory cell MC are the same as those described in FIG. 8. The waveform of the word line RWLR connected to an accessed reference cell RMC are the same as those described in the word line WLL2, except that the word line RWLR is set at a voltage corresponding to the power supply voltage VDD during a data rewrite period ((g) of FIG. 11). Since the data "0" is constantly rewritten in the reference cell RMC, a high-level voltage of the word line RWLR during the rewrite period may be the power supply voltage VDD that is lower than the high-level voltage of the word line WLL2.

The voltage of the bit line BLR4 connected to an accessed reference cell RMC becomes an intermediate value of a voltage of the bit line BLL0 of the data "1" and a voltage of the bit line BLL0 of the data "0," during a high-level period of the bit line selection signal BLSZR4 ((h) of FIG. 11). The voltage of the bit line BLR4 is set to the low level in accordance with the bit line selection signal BLSXR4 (not shown) that changes to the high level corresponding to the low level of the bit line selection signal BLSZR4 during a rewrite period ((i) of FIG. 11).

The read operation shown in FIG. 11 is the same as the read operation shown in FIG. 8 except that the sense amplifier SA amplifies a difference between data being read out of the memory cell MC to the bit line BL and data being read out of the reference cell RMC to the bit line /BL. In this arrangement, writing of "1" and writing of "0" during restoring of the memory cell MC can be performed at the same timing, the cycle time period upon accessing the memory can be reduced, and a random access can be performed at a high speed. However, in order to prevent the reference cell RMC to be accessed from being rewritten to "1," plate lines PLo and PLR4 connected to the reference cell RMC are set to the high level "H" (VDD) during the read operation period.

In the semiconductor memory device 102 in which one reference cell RMC is adopted with respect to a plurality of memory cells MC, an access frequency of the reference cell RMC during the random access is higher than the access frequency of the memory cell MC. In this arrangement, there is a difference in the variation in the residual polarization value between the memory cell MC and the reference cell RMC, which may reduce a data read margin. On the other hand, in the semiconductor memory device 300 in which the number of memory cells MC is the same as the number of reference cells RMC, the access frequency of the reference cell RMC is the same as the access frequency of the memory cell MC.

FIG. 12 shows an example of a time variation in the residual polarization value of each of the reference cell RMC and the memory cell MC. In FIG. 12, an interval between writing and reading (hereinafter referred to as a "WR-RD interval") indicates a time period from the writing of data to the reference cell RMC or the memory cell MC, to the reading of the data. For example, the WR-RD interval indicates a time period from rewriting to reading of data in a subsequent access.

For example, the residual polarization value of the reference cell RMC storing data "0" (U-term) increases in accordance with a longer WR-RD interval. Due to the increase in the remanent polarization value, an amount of a signal that is read out of the reference cell RMC to a bit line during the read operation decreases.

As shown in the upper right part of FIG. 12, the remanent polarization value of the memory cell MC storing the data "0" (U-term) increases in accordance with a longer WR-RD interval. The remanent polarization value of the memory cell MC storing the data "1" (P-term) decreases in accordance with a longer WR-RD interval.

A read margin is indicated by each of (i) a difference between remanent polarization values of a P-term memory cell MC and a U-term reference cell RMC, and (ii) a difference between remanent polarization values of a U-term memory cell MC and the U-term reference cell RMC. In this case, when in the random access, an access frequency of the reference cell RMC is different from an access frequency of the memory cell MC, a value of the shortest read margin is reduced.

The shortest read margin for the P-term memory cell MC is obtained when a longer WR-RD interval for each of the memory cell MC and the reference cell RMC is obtained. The shortest read margin for the U-term memory cell MC is obtained when the WR-RD interval for the U-term memory cell MC is long and the WR-RD interval for the reference cell RMC is short.

In this arrangement, by writing the reference cell RMC to "0" in advance when accessing the memory cell MC, the WR-RD interval for the reference cell RMC constantly becomes short. An area of the ferroelectric capacitor FC in the reference cell RMC is set such that the residual polarization value of the reference cell RMC at the time of writing "0" becomes an intermediate value of the residual polarization value of the P-term memory cell MC and the residual polarization value of the U-term memory cell MC. With this approach, as shown in the lower right part of FIG. 12, changes in the residual polarization value of the reference cell RMC can be suppressed. As a result, even when access frequencies of the reference cell RMC and the memory cell MC are different from each other, decreases in the read margin for each of the P-term and U-term memory cell MC can be suppressed.

Figure 13:
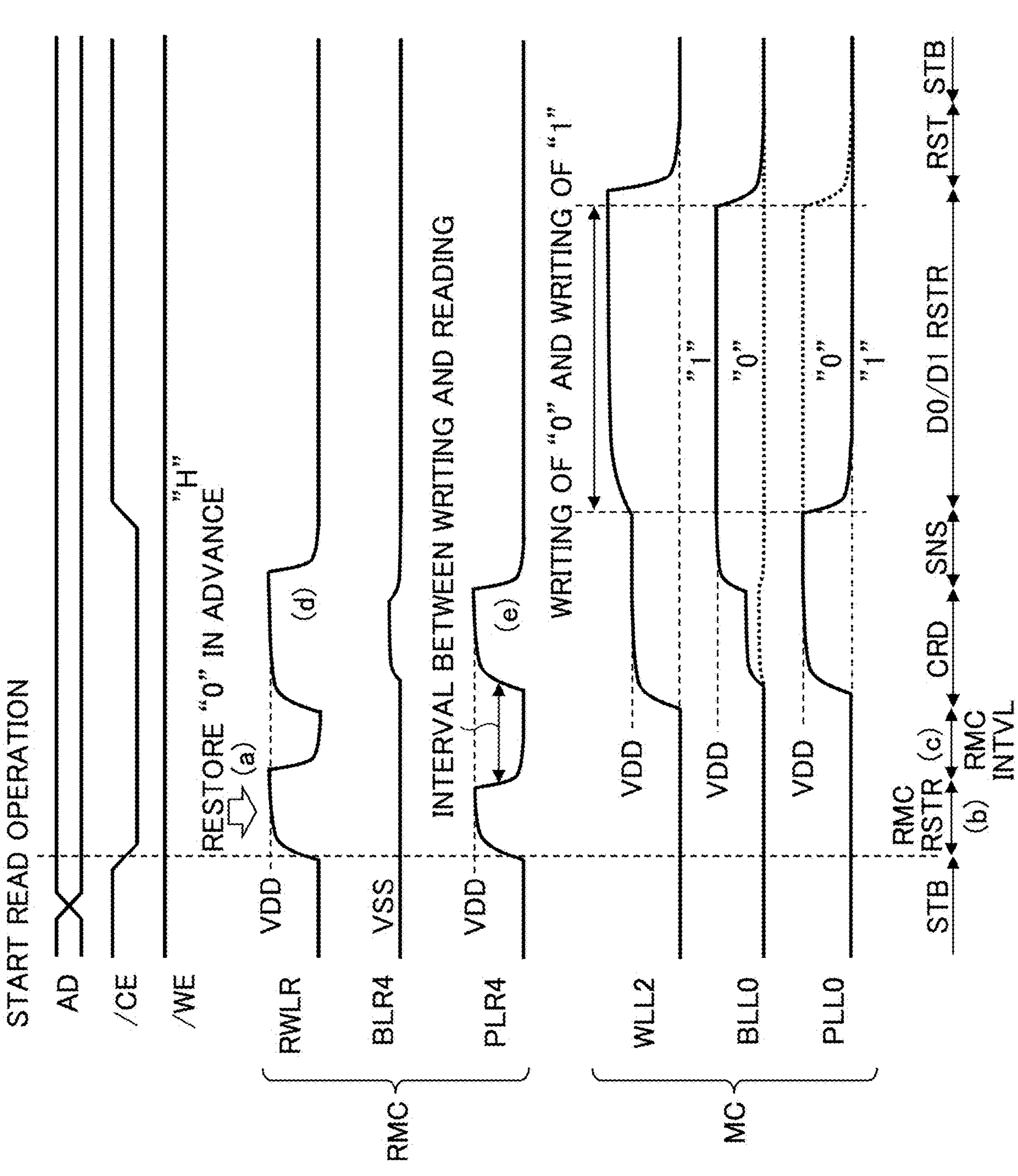
FIG. 13 is a timing chart showing another example of the access operation of the semiconductor memory device including the subarrays in FIG. 10.

FIG. 13 shows another example of the access operation of the semiconductor memory device 102 including the subarrays SARY in FIG. 10. In the read operation performed in FIG. 13, preliminary restoration of "0" to the reference cell RMC is added in the read operation shown in FIG. 11 ((a) of FIG. 13). That is, before a read period CRD of the memory cell MC, a restoration period RMC-RSTR of the reference cell RMC, and a WR-RD interval period RMC-INTVL of the reference cell RMC are added ((b) and (c) of FIG. 13). Operations after performing the preliminary restoration of "0" are the same as described in FIG. 11. FIG. 13 shows only main waveforms among the waveforms shown in FIG. 12.

By introducing the preliminary restoration of "0," the restoration of "0" to the reference cell RMC can be eliminated when data is read out of the memory cell MC. With this approach, the waveform on a word line RWLR that is connected to the reference cell RMC is set to have the high level during the read period CRD and a sense period SNS, and then a word line RWLR is set to have the low level ((d) of FIG. 13). Similarly, the waveform of a plate line PLR4 that is connected to the reference cell RMC is set to have the high level during the read period CRD and the sense period, and then a plate line PLR4 is set to have the low level ((e) of FIG. 13).

With this arrangement, the WR-RD interval for the reference cell RMC can be set to define a shorter constant period regardless of the access frequency of the reference cell RMC. As a result, even when the access frequency of the reference cell RMC is different from that of the memory cell MC, decreases in the read margin for the memory cell MC can be suppressed.

As described above, the embodiments illustrated in FIGS. 10 to 13 obtain the same effects as described in the embodiments shown in FIGS. 1 to 9. For example, writing of "1" and writing of "0" can be performed at the same timing at which the memory cell MC is restored, a cycle time period upon accessing the memory can be reduced, and the random access can be performed at a high speed.

Further, in the present embodiment, when the memory cell MC is accessed, the plate line PLo (or PLe) connected to the reference cell RMC is set to the high level "H," and thus the reference cell RMC can be prevented from being rewritten to "1."

By performing the restoration of "0" to the reference cell RMC in advance when accessing the memory cell MC, the WR-RD interval for the reference cell RMC can be set to define a short constant period regardless of the access frequency of the reference cell RMC. As a result, even when the access frequency of the reference cell RMC is different from the access frequency of the memory cell MC, it is possible to suppress the reduction in the read margin of the memory cell MC.

FIG. 14 shows an example of two circuits of the subarray of the semiconductor memory device according to another embodiment. The detailed description of the same components as described in FIG. 10 is omitted. For example, a semiconductor memory device 104 shown in FIG. 14 includes a plurality of subarrays SARY, a control circuit CNTL, a row decoder RDEC, a read amplifier RA, and a write amplifier WA, as in the semiconductor memory device 100 shown in FIG. 1. The semiconductor memory device 104 is mounted in each of various electronic devices as a single memory device.

The semiconductor memory device 104 shown in FIG. 14 is a 1T1C type device. The semiconductor memory device 104 includes reference cells RMC that are arranged in a row along the Y direction on an opposite side of a region of memory cells MC, which are arranged on each of the right and left sides of FIG. 14, from the sense amplifier SA in the subarray SARY. The inner circuits of reference cells RMC that are arranged on each of the negative X side and positive X side of FIG. 14 are the same as those described in FIG. 10. The write enable signals WREZe and WREZo for controlling the plate line control circuits PLeCNT and PLOCNT are omitted. Circuits outside the reference cells RMC will be described with reference to FIGS. 15 and 16.

Figure 15:
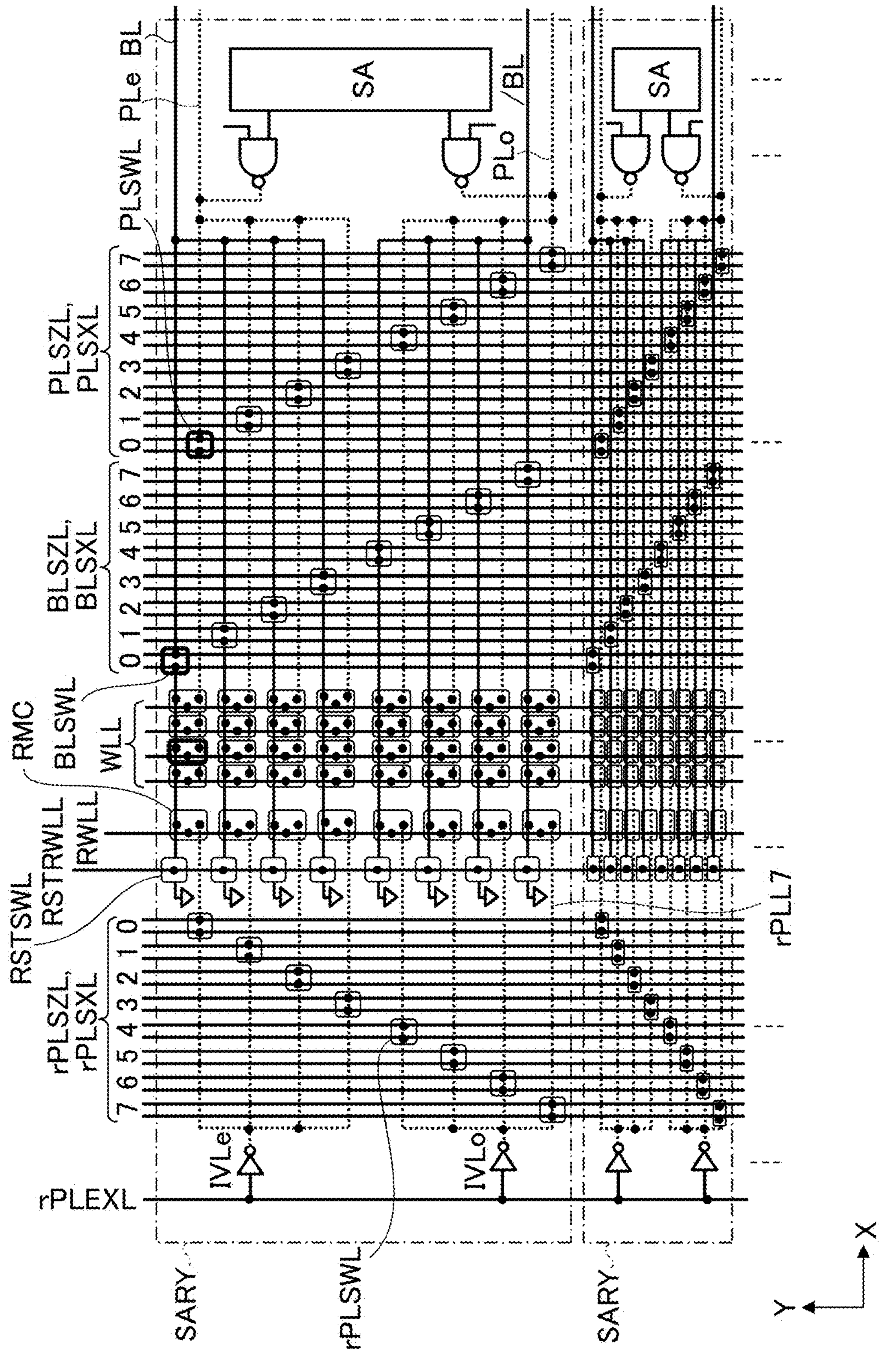
FIG. 15 is a block diagram showing an example of components arranged on the left side of the subarray in FIG. 14.
Figure 16:
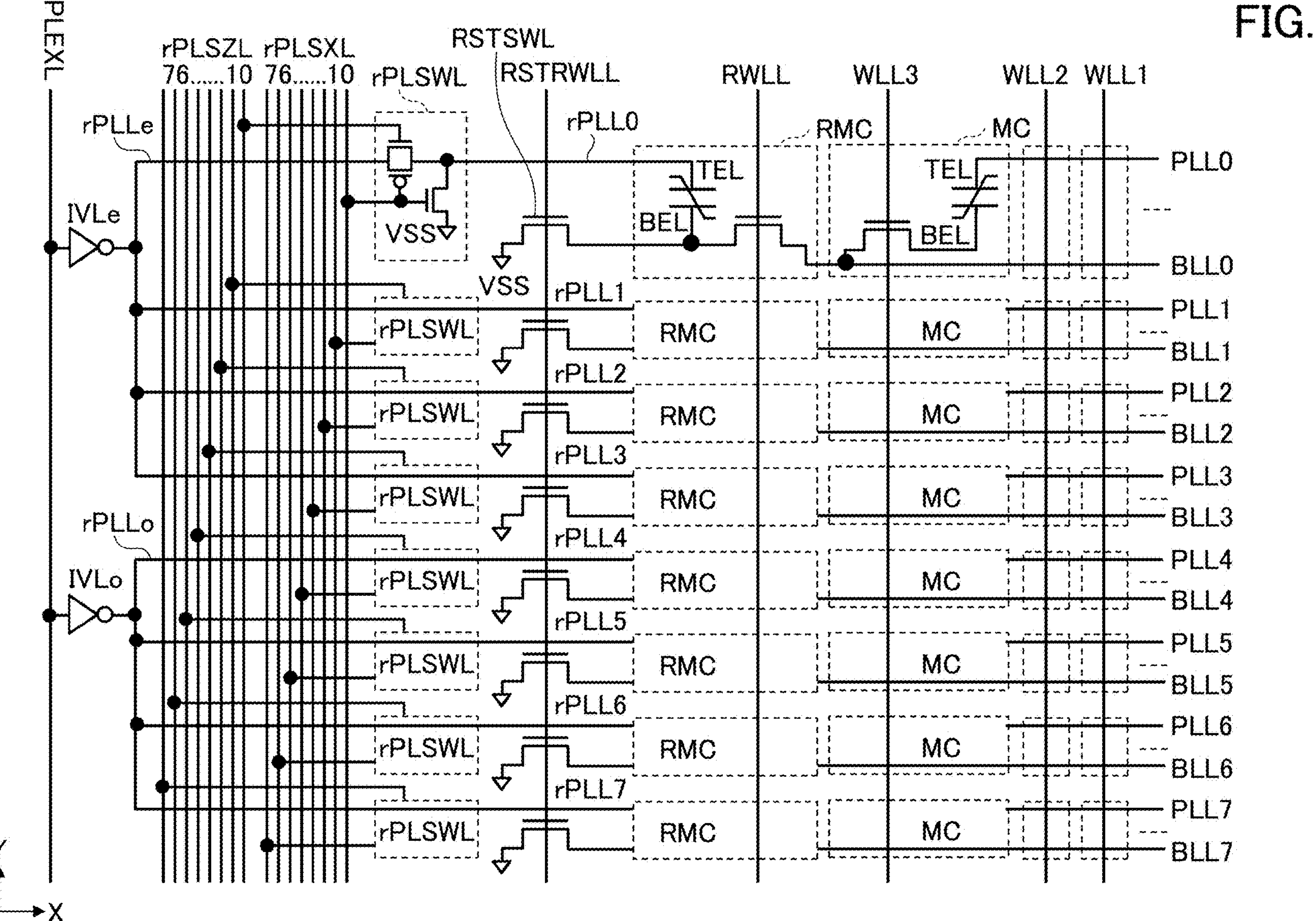
FIG. 16 is a circuit diagram showing an example of a main part of the subarray on the left side in FIG. 14.
Figure 17:
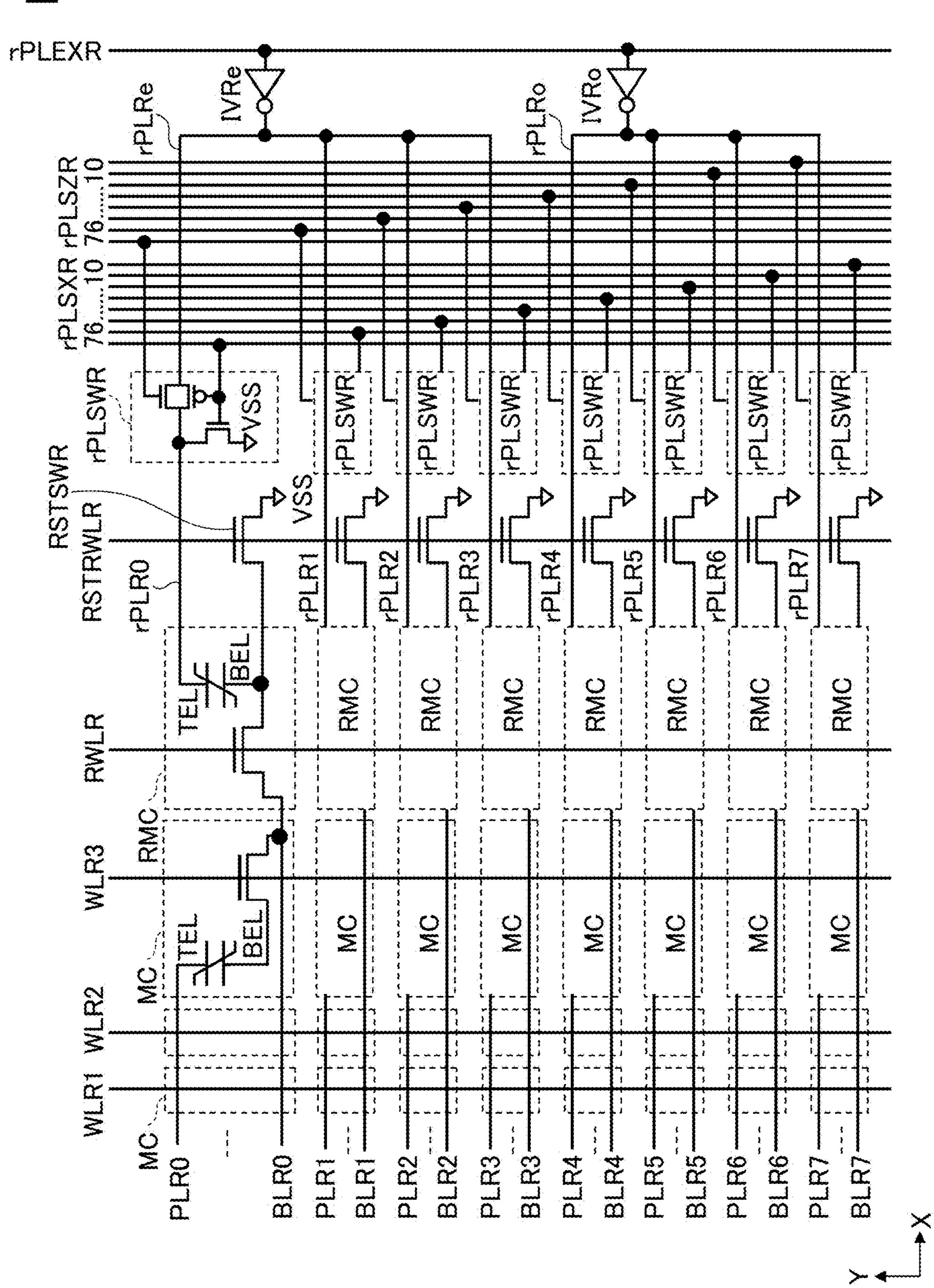
FIG. 17 is a circuit diagram showing an example of a main part of the subarray on the right side in FIG. 14.

FIG. 15 shows an example of the circuit arranged on the negative X side of the subarray SARY in FIG. 14. The memory cell MC, the bit line switch BLSWL and the plate line switch PLSWL as shown with thick lines in FIG. 15 show circuits that operate in the first access in FIG. 18 described below. FIG. 16 shows an example of a main part on the negative X side of the subarray in FIG. 14. FIG. 17 shows an example of a main part on the positive X side of the subarray in FIG. 14. A circuit shown in FIG. 17 is symmetrical with a circuit shown in FIG. 16, and is the same as that shown in FIG. 16 except that an end part of some signal symbols indicates "R" instead of "L." Accordingly, the description of the circuit in FIG. 17 is omitted. The circuits shown in FIGS. 15 and 16 will be described below.

In the present embodiment, plate lines for the memory cells MC are separate from plate lines for the reference cells RMC. Plate lines rPLL (rPLLo to rPLL7) connected to the respective reference cells RMC are each connected to a plate line rPL (rPLe or rPLo) via a given plate line switch rPLSWL. The plate line rPLL is connected to the output of an inverter IVL (IVLe or IVLo) that receives an input of a plate drive signal rPLEXL.

Each inverter IVL outputs a signal obtained by inverting a logic level of the plate line drive signal rPLEXL, to the given plate lines rPLLe and rPLLo. An inverted signal with respect to the plate line drive signal rPLEXL is output to the plate line rPLL connected to the reference cell RMC to be accessed via the plate line switch rPLSWL that is turned on.

As shown in FIG. 16, the plate line switch rPLSWL has the same circuit configuration as the plate line switch PLSWL shown in FIG. 3. The plate line switch rPLSWL is turned on or off in accordance with a given plate line selection signal rPLSZL (one of rPLSZL0 to rPLSZL7) or rPLSXL (one of rPLSXL0 to rPLSXL7). In addition, the plate line switch rPLSWL connects the plate line rPLL to the ground line VSS, during a high-level period (off period of the plate line switch rPLSWL) of a corresponding plate line selection signal rPLSXL.

As shown in FIG. 16, a reset switch RSTSWL includes an n-channel MOS transistor whose gate is connected to a reset signal line RSTRWLL, whose drain is connected to the lower electrode BEL of the reference cell RMC, and whose source is connected to the ground line VSS. The reset switch RSTSWL is turned on during a high-level period of the reset signal RSTRWLL, and thus the lower electrode BEL of the reference cell RMC is set to "0."

By arranging the reference cells RMC on both negative and positive X sides of the subarray SARY, reset switches RSTSWL can be easily arranged, and reference cells RMC can be easily connected to plate lines rPLL that are different from plate lines PLL. In addition, the inverter IVL and the plate line switch rPLSWL for controlling the voltage of the plate line rPLL can be easily arranged.

In the semiconductor memory device 104, the preliminary restoration of "0" to the reference cell RMC described in FIGS. 12 and 13 can be performed separately from the accessing of the memory cell MC by using the inverter IVL, the plate line switch rPLSWL, and the reset switch RSTSWL. Thus, as described in FIG. 19, when the read operation is continuously performed, a restoration operation in which "0" is preliminarily restored can be concurrently performed during a restoration period of the read operation that is immediately performed before the restoration operation.

Figure 18:
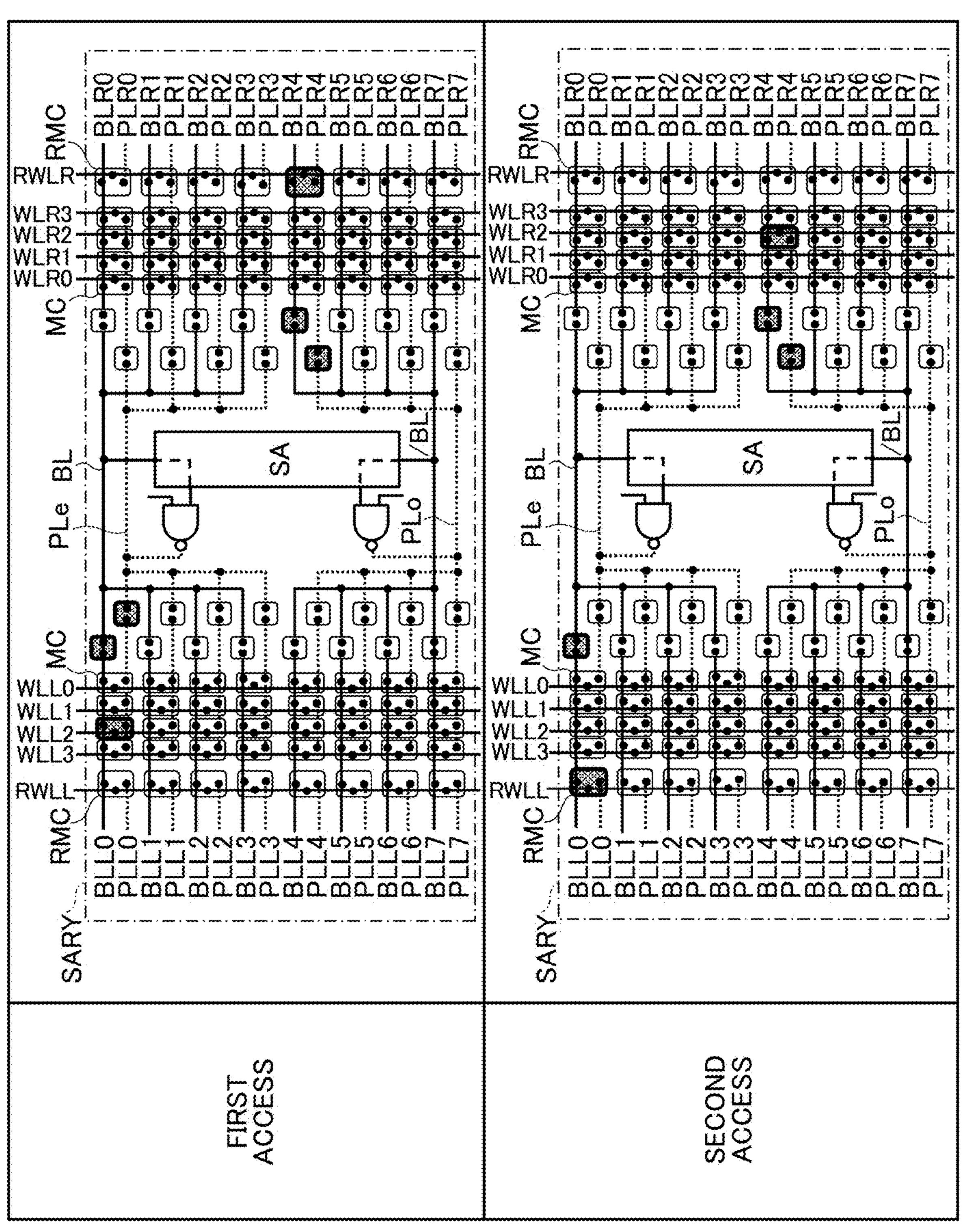
FIG. 18 is a diagram showing a position example of memory cells and reference cells in a case where an access operation of the semiconductor memory device in FIG. 14 is continuously performed to access the memory cells.

FIG. 18 shows a position example of the memory cell MC and the reference cell RMC that are accessed when the access operation is continuously performed at the semiconductor memory device 104 in FIG. 14. The positions of the memory cell MC and the reference cell RMC to be accessed are expressed with hatching. Hereinafter, in the continuous access operation, a first access operation is referred to as "first access," and a subsequent access operation is referred to as "second access."

For example, in the first access, the memory cell MC connected to a word line WLL2 and the bit line BLL0, and the reference cell RMC connected to a bit line BLR4 are accessed. In the second access, the memory cell MC connected to the word line WLR2 and a bit line BLR4, and the reference cell RMC connected to the bit line BLL0 are accessed. While the memory cell MC is being accessed by the first access, "0" is preliminarily restored to the reference cell RMC by the second access.

Figure 20:
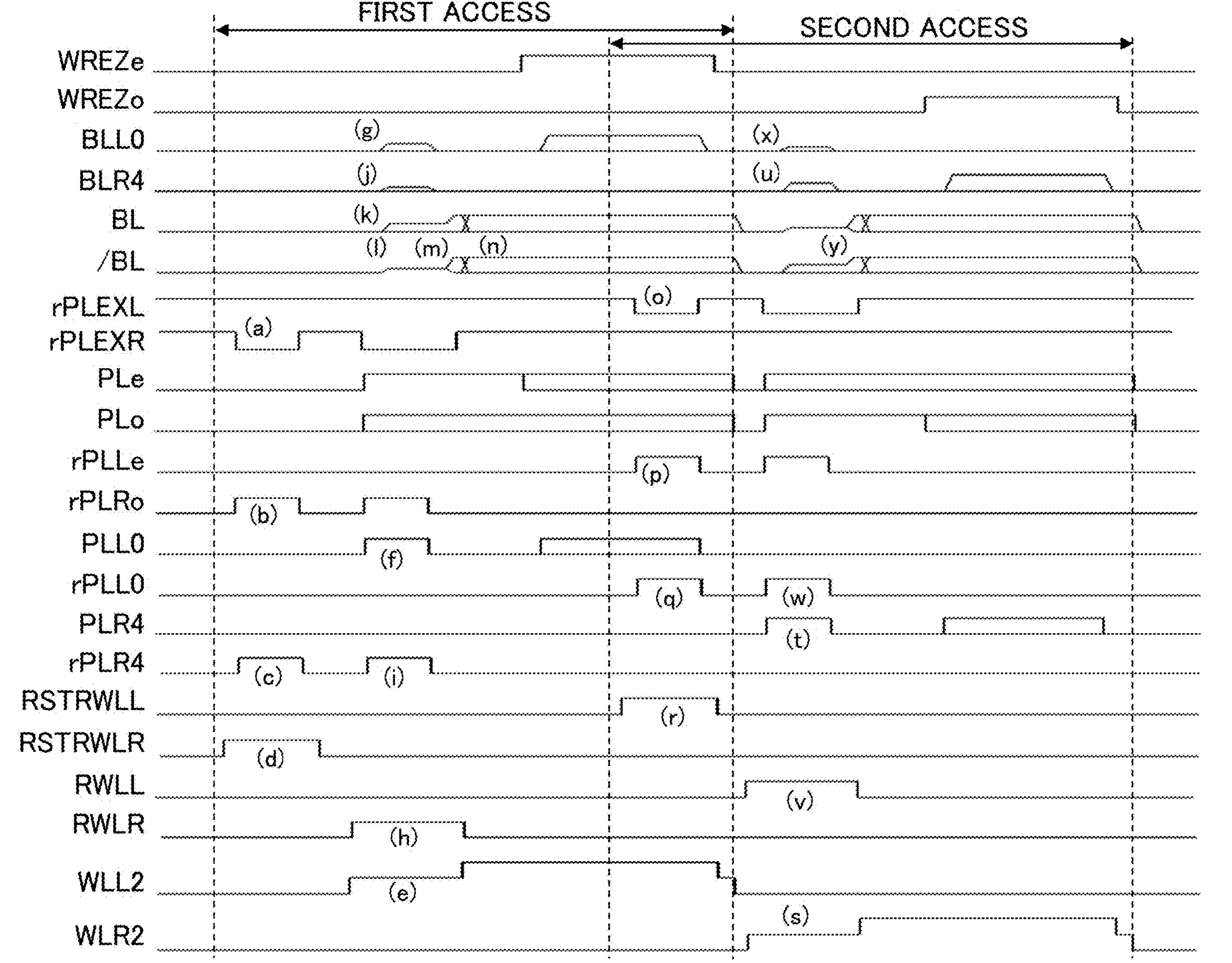
FIG. 20 is a timing chart showing an example of various signals used to generate waveforms shown in FIG. 19.

FIG. 19 shows an example of the access operation of the semiconductor memory device 104 including the subarray SARY in FIG. 14. FIG. 20 shows an example of various signals used to generate the waveforms shown in FIG. 19. In FIG. 19, word lines WLL and WLR are expressed using WL, reference word lines RWLL and RWLR are expressed using RWL, plate lines PLL and PLR are expressed using PL, and reference plate lines rPLL and rPLR are expressed using BL. A specific waveform of each signal line will be described below with reference to FIG. 20. In FIG. 19, the write operation is performed in the first access, and the read operation is performed in the second access. In each of the first access and the second access, the memory cell MC and the reference cell RMC shown with the hatching in FIG. 18 are accessed.

First, when each of a chip enable signal /CE and a write enable signal /WE changes to a low level in a state where a predetermined address signal AD is being applied, the write operation is started ((a) of FIG. 19). In the write operation, as in FIG. 13, preliminary restoration of "0" is performed ((b) of FIG. 19).

As shown in FIG. 20, in the preliminary restoration of "0," when a plate line drive signal rPLEXR is set to the low level, the reference plate line rPLRo is set to the high level through the inverter IVRo ((a) and (b) of FIG. 20). The high level of the reference plate line rPLRo is transmitted to a reference plate line rPLR4 through the plate line switch rPLSWR ((c) of FIG. 20). Further, the lower electrode BEL of the reference cell RMC is set to the low level through the reset switch RSTSWR that receives a high-level reset signal RSTRWLR ((d) of FIG. 20). As a result, data "0" is restored to the reference cell RMC to be accessed (preliminary restoration of "0").

Thereafter, as shown in FIG. 19, the word line WL, the reference word line RWL, and the plate line PL are set to the high level ((c) of FIG. 19), similarly to a case in FIG. 13. Then, data is read out of the memory cell MC and the reference cell RMC to the bit lines BL and /BL ((d) of FIG. 19). After the data on the bit lines BL and /BL is used to perform differential amplification by the sense amplifier SA, write data is provided to the bit lines BL and /BL ((e) of FIG. 19).

Specifically, as shown in FIG. 20, the word line WLL2 and the plate line PLLo are sequentially set to the high level, and data is read out of the memory cell MC to the bit line BLL0 ((e), (f) and (g) of FIG. 20). At the same time, the reference word line RWLR and the reference plate line rPLR4 are set to the high level, and data is read out of the reference cell RMC to the bit line BLR4 ((h), (i), and (j) of FIG. 20).

The data on the bit line BLL0 is transmitted to the bit line BL via the bit line switch BLSWL that is turned on by the bit line selection signal BLSZL0 having the high level ((k) of FIG. 20). The data on the bit line BLR4 is transmitted to the bit line /BL via the bit line switch BLSWR that is turned on by the bit line selection signal BLSZR4 having the high level ((l) of FIG. 20).

Then, the data on the bit lines BL and /BL is amplified by the sense amplifier SA, and a logical value of the data stored in the memory cell MC is determined ((m) of FIG. 20). Thereafter, the data on the bit lines BL and /BL are rewritten to write data ((n) of FIG. 20). A subsequent restoration operation to the memory cell MC in the first access is the same as the restoration operation in FIG. 13.

As shown in FIG. 19, the second access is started within an overlap period that includes an end duration of the restoration period RSTR and the reset period RST in the first access, and preliminary restoration of "0" in the second access is performed ((f) of FIG. 19). Specifically, as shown in FIG. 20, in the preliminary restoration of "0" in the second access, a plate line drive signal rPLEXL is set to the low level, and thus the reference plate line rPLLe is set to the high level ((o) and (p) of FIG. 20). The high level of the reference plate line rPLLe is transmitted to the reference plate line rPLLo through the plate line switch rPLSWL ((q) of FIG. 20). Further, the lower electrode BEL of the reference cell RMC that is connected to the bit line BLL0 is set to the low level through the reset switch RSTSWL that receives the reset signal RSTRWLL having the high level ((r) of FIG. 20). As a result, the data "0" is restored to the reference cell RMC to be accessed (preliminary restoration of "0").

Thereafter, similarly to a case in FIG. 13, the word line WRR2 and the plate line PLR4 are set to the high level sequentially, and data is read out of the memory cell MC to the bit line BLR4 ((s), (t), and (u) of FIG. 20). At the same time, the reference word line RWLL and the reference plate line rPLLo are set to the high level, and data is read out of the reference cell RMC to the bit line BLL0 ((v), (w), and (x) of FIG. 20). Then, the data on the bit lines BL and /BL is amplified by the sense amplifier SA, and a logical value of the data stored in the memory cell MC is determined ((y) of FIG. 20).

As described above, in the present embodiment, a preliminary restoration period in which "0" is restored is overlapped with a part of the restoration period and the reset period that are obtained in a previous access operation. Thus, a cycle time period that is recognized from the outside of the semiconductor memory device 104 can be reduced compared with a cycle time period that is recognized from the inside of the semiconductor memory device 104, and the random access can be performed at a high speed. Further, when the memory cell MC is accessed, in a case where the plate line PLo (or PLe) connected to the reference cell RMC is set to the high level "H," the reference cell RMC can be prevented from being rewritten to "1."

As described above, in the embodiments shown in FIGS. 14 to 20, the same effects as described in the embodiments shown in FIGS. 1 to 13 can be obtained. For example, when the memory cell MC is restored, the writing of "1" and the writing of "0" can be performed at the same timing, and as a result, the cycle time period upon accessing the memory can be reduced, and the random access can be performed at a high speed.

Furthermore, in the present embodiment, a period in which the preliminary restoration of "0" is performed in a subsequent access operation is overlapped with a latter half of the access operation. With this approach, the cycle time period that is recognized from the outside of the semiconductor memory device 104 can be reduced compared with the cycle time period that is recognized from the inside of the semiconductor memory device 104. As a result, the random access can be performed at a higher speed.

By arranging the reference cells RMC on both negative and positive X sides of the subarray SARY, the reset switches RSTSWL and RSTSWR can be easily arranged. The reference cells RMC can be easily connected to the plate lines rPLL and rPLR that are different from the plate lines PLL and PLR. In addition, the inverters IVL and IVR, and the plate line switches rPLSWL and rPLSWR, for controlling the voltages of the plate lines rPLL and rPLR can be easily arranged.

Figure 21:
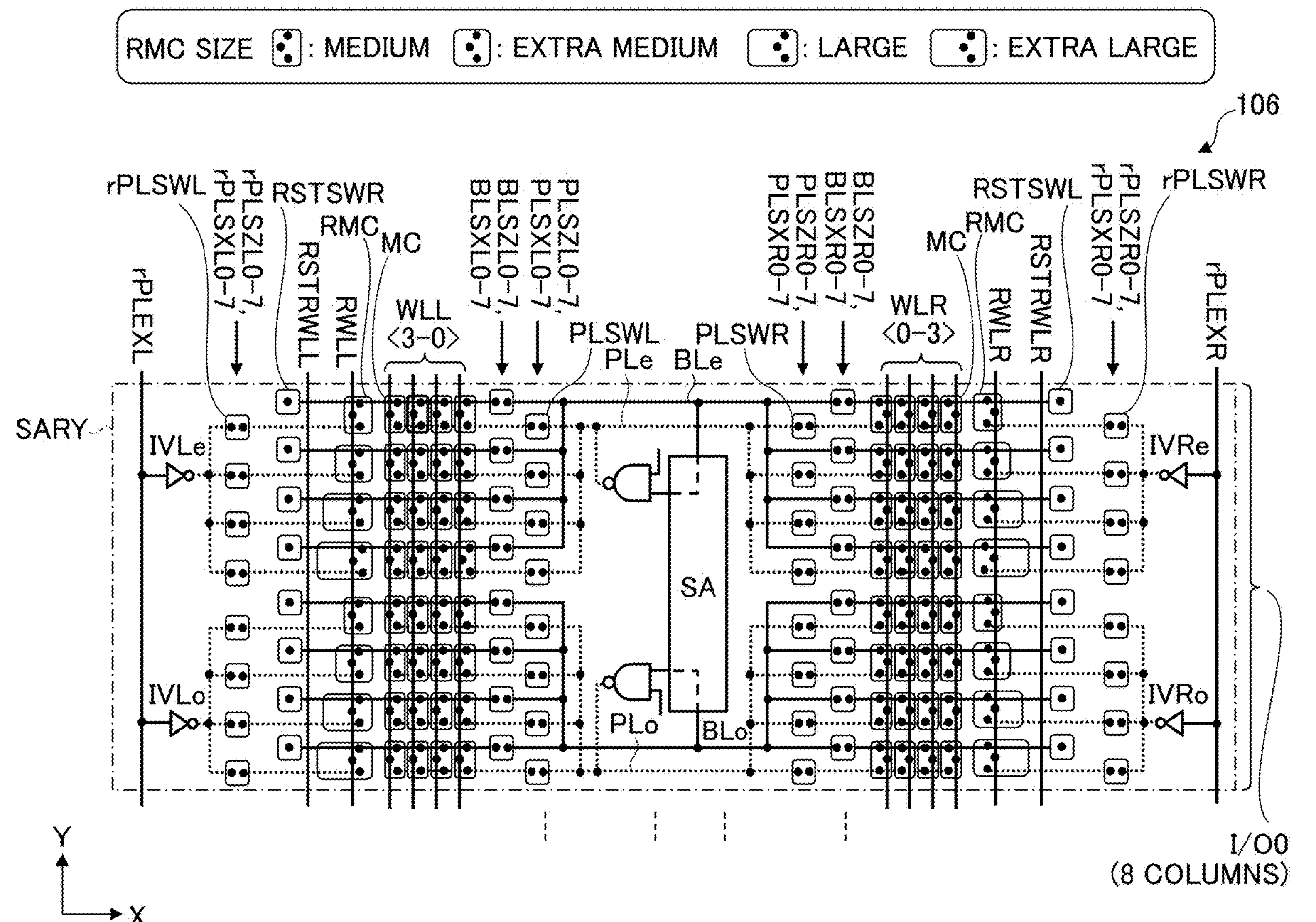
FIG. 21 is a block diagram showing a circuit example of two subarrays in the semiconductor memory device according to yet another embodiment.

FIG. 21 shows an example of the circuit of the two subarrays of the semiconductor memory device according to yet another embodiment. The same components as those shown in FIGS. 14 to 17 are not be described in detail. For example, as in the semiconductor memory device 100 shown in FIG. 1, a semiconductor memory device 106 shown in FIG. 21 includes a plurality of subarrays SARY, a control circuit CNTL, a row decoder RDEC, a read amplifier RA, and a write amplifier WA. The semiconductor memory device 106 is mounted in each of various electronic devices as a single memory device.

The subarray SARY includes reference cells RMC having a plurality of sizes. For example, each of the reference cells RMC has one of medium size, extra medium size, large size, and extra large size. For example, the semiconductor memory device 106 may be implemented by changing the sizes of the reference cells RMC that are arranged in the Y direction in the semiconductor memory device 104 shown in FIG. 14.

Then, among the reference cells RMC each of which has any one of four sizes, reference cells RMC having the same size are constantly used to read and access data from the memory cells MC. In this arrangement, when any one of the memory cells MC is accessed, the control circuit CNTL (FIG. 1) constantly selects reference cells RMC having the same size, and connects the reference cells RMC to the bit line BLe (or BL0). Also, the control circuit CNTL may constantly cause the reference cells RMC of the same size to preliminarily restore "0." The control circuit CNTL for selecting one or more reference cells RMC is an example of a reference selection controller.

For example, a pair of reference cells RMC of the same size connected to one end of the bit line BLe and the other end of the bit line BL0 is an example of a first reference cell and a second reference cell. When data is read out of the memory cell MC that is connected to the other end of the bit line BLo, the first reference cell is connected to the bit line BLe and the plate line PLe. When data is read out of the memory cell MC that is connected to one end of the bit line BLe, a second reference cell is connected to the bit line BLo and the plate line PLO.

It is preliminarily determined which of the reference cells RMC is used before shipping of the semiconductor memory device 106. For example, the semiconductor memory device 106 includes a program circuit in which information indicating a reference cell RMC to be selected is programmed. The control circuit CNTL selects the reference cell RMC to be used in the access operation, based on information that is programmed in the program circuit in a manufacturing process (e.g., testing process). The program circuit may have a ferroelectric capacitor FC that is provided in a region separate from the subarray SARY, or may have a fuse.

For example, when it is found that a read margin is decreased in the testing process of the semiconductor memory device 106 due to variations in a manufacturing condition of the semiconductor memory device 106 in the semiconductor manufacturing process, use of an appropriate reference cell RMC that can secure a predetermined read margin is determined.

As described above, in the embodiment illustrated in FIG. 21, the same effects as those described in the above embodiments can be obtained. Furthermore, in this embodiment, by providing and selectively enabling the use of reference cells RMC having different sizes, an appropriate reference cell RMC can be used in accordance with characteristics of a manufactured semiconductor memory device 106. As a result, decreases in the read margin of the semiconductor memory device 106 can be suppressed.

The semiconductor memory devices 102, 104, and 106 shown in FIGS. 10, 14, and 21 having the reference cells RMC can be used not only as 1T1C type devices but also as 2T2C type devices. This is because the circuit configuration of the memory cell MC, the bit lines (BL and the like), the plate lines (PLe and the like), the sense amplifier SA, and the plate line control circuits PLeCNT and PLOCNT is the same as those of the 2T2C type subarray SARY shown in FIG. 2. When any semiconductor memory device is used as the 2T2C type device, in a case where data is read, complementary data is stored in a pair of memory cells MC without using a reference cell RMC, to thereby perform differential amplification through the sense amplifier SA.

In this case, a function of the control circuit CNTL and the row decoder RDEC and the like shown in FIG. 1 can be switched between a 2T2C type function and a 1T1C type function. In this arrangement, for example, a 2T2C type device is implemented immediately after mass production when a manufacturing condition is not stable and first-pass yield is not stable. Then, the 2T2C type device can be changed to a 1T1C type device when the manufacturing condition and the first-pass yield are stable.

As described above in detail, the features and advantages described in the embodiments will be made clear. These embodiments are not intended to limit a scope and a gist of the disclosure. Various changes, modifications, omissions, and substitutions may be made without departing from the scope of the disclosure.

In the present disclosure, a cycle time period for accessing a memory cell including a ferroelectric capacitor can be reduced.

What is claimed is:

1. A semiconductor memory device comprising:

at least one first memory cell and at least one second memory cell each of which includes a ferroelectric capacitor configured to hold data;

a first bit line and a first plate line that are coupled to the first memory cell;

a second bit line and a second plate line that are coupled to the second memory cell;

a sense amplifier configured to amplify a difference between (i) the data that is read out of the first memory cell upon driving the first plate line and (ii) the data that is read out of the second memory cell upon driving the second plate line;

a first restoration circuit configured to output, to the first plate line, a level obtained by inverting a first logic level of the data on the first bit line, the first logic level being obtained by performing differential amplification through the sense amplifier; and a second restoration circuit configured to output, to the second plate line, a level obtained by inverting a second logic level of the data on the second bit line, the second logic level being obtained by performing the differential amplification through the sense amplifier.

2. The semiconductor memory device according to claim 1, wherein the first restoration circuit includes an input coupled to a first node in the sense amplifier, the first node being coupled to the first bit line, and wherein the second restoration circuit includes an input coupled to a second node in the sense amplifier, the second node being coupled to the second bit line.

3. The semiconductor memory device according to claim 1, wherein the first plate line is wired to be in parallel with the first bit line, and the second plate line is wired in parallel with the second bit line.

4. The semiconductor memory device according to claim 1, wherein the at least one first memory cell includes a plurality of first memory cells, and the at least one second memory cell includes a plurality of second memory cells, and wherein the semiconductor memory device further includes a plurality of first bit line switches coupling the respective first memory cells to the first bit line, a plurality of first plate line switches coupling the respective first memory cells to the first plate line, a plurality of second bit line switches coupling the respective second memory cells to the second bit line, a plurality of second plate line switches coupling the respective second memory cells to the second plate line, and wherein each of the sense amplifier, the first restoration circuit, and the second restoration circuit shares the plurality of first memory cells and the plurality of second memory cells.

5. The semiconductor memory device according to claim 1, further comprising:

a first reference cell coupled to the first bit line and the first plate line, and exclusively coupled to the first memory cell, the first reference cell including a ferroelectric capacitor configured to hold reference data; and a second reference cell coupled to the second bit line and the second plate line, and exclusively coupled to the second memory cell, the second reference cell including a second ferroelectric capacitor configured to hold reference data, and wherein the sense amplifier is configured to amplify a difference between the data stored in the first memory cell and the reference data stored in the second reference cell, or to amplify a difference between the data stored in the second memory cell and the reference data stored in the first reference cell, and wherein the first restoration circuit or the second restoration circuit is configured to receive the reference data that is obtained by performing differential amplification through the sense amplifier, output, to a corresponding plate line among the first plate line and the second plate line, a data level that enables the reference data in each of the first reference cell and the second reference cell to be restrained from being rewritten, regardless of a logic level of the reference data.

6. The semiconductor memory device according to claim 5, wherein each of the first reference cell and the second reference cell stores data “0” corresponding to an intermediate value of the data “0” stored in the first memory cell and data “1” stored in the second memory cell, and wherein during a read cycle period in which the data is read out of the first memory cell or the second memory cell, the data “0” is configured to be restored to the second reference cell or the first reference cell, before reading the data out of the first memory cell to the first bit line or reading the data out of the second memory cell to the second bit line.

7. The semiconductor memory device according to claim 5, wherein each of the first memory cell and the second memory cell stores complementary data, without using the first reference cell and the second reference cell, and wherein the sense amplifier is configured to amplify a difference between pieces of the complementary data that are read out of the first memory cell and the second memory cell to the first bit line and the second bit line.

8. A semiconductor memory device comprising:

a first memory cell and a second memory cell each of which includes a ferroelectric capacitor configured to hold data;

a first bit line and a first plate line that are coupled to the first memory cell;

a second bit line and a second plate line that coupled to the second memory cell;

at least one first reference cell coupled to the first bit line and the first plate line, and exclusively coupled to the first memory cell, the first reference cell including a ferroelectric capacitor configured to hold reference data;

at least one second reference cell coupled to the second bit line and the second plate line, and exclusively coupled to the second memory cell, the second reference cell including a ferroelectric capacitor configured to hold reference data;

a third plate line coupled to the first reference cell;

a fourth plate line coupled to the second reference cell;

a first reset switch configured to reset the first bit line to a low level;

a second reset switch configured to reset the second bit line to the low level;

a sense amplifier configured to amplify a difference between (i) the data that is read out of the first memory cell to the first bit line upon driving the first plate line and (ii) the reference data that is read out of the second reference cell to the second bit line upon driving the second plate line, or amplify a difference between (i) the data that is read out of the second memory cell to the second bit line upon driving the second plate line and (ii) the reference data that is read out of the first reference cell to the first bit line upon driving the first plate line;

a first restoration circuit configured to output, to the first plate line, a data level obtained by inverting a logic level of the data on the first bit line that is obtained by perform differential amplification through the sense amplifier; and a second restoration circuit configured to output, to the second plate line, a data level obtained by inverting a logic level of the data on the second bit line that is obtained by performing the differential amplification through the sense amplifier, wherein during a read cycle period in which the data is read out of the first memory cell or the second memory cell, data “0” is configured to be restored to the second reference cell upon occurrence of a condition in which before reading the data out of the first memory cell to the first bit line, the fourth plate line is set to a high level and the second reset switch is turned on, or the data “0” is configured to be restored to the first reference cell upon occurrence of a condition in which before reading the data out of the second memory cell to the second bit line, the third plate line is set to the high level and the first reset switch is turned on.

9. The semiconductor memory device according to claim 8, wherein the first reference cell is located on an end side of the first bit line farther from the sense amplifier, and the second reference cell is located on an end side of the second bit line farther from the sense amplifier.

10. The semiconductor memory device according to claim 8, wherein the at least one first reference cell includes a plurality of first reference cells, and the at least one second reference cell includes a plurality of second reference cells, wherein the semiconductor memory device further includes a reference selection controller configured to select a pair of a given first reference cell and a given second reference cell, from among the plurality of first reference cells and the plurality of second reference cells, each of the given first reference cell and the given second reference cell having a same size, couple the given first reference cell to the first bit line, the first plate line, and the third plate line, and couple the given second reference cell to the second bit line, the second plate line, and the fourth plate line.

11. A method for controlling a semiconductor memory device that includes a first memory cell and a second memory cell each of which includes a ferroelectric capacitor for holding data, a first bit line and a first plate line that are coupled to the first memory cell, and a second bit line and a second plate line that are coupled to the second memory cell, the method comprising:

amplifying a difference between the data that is read out of the first memory cell to the first bit line upon driving the first plate line and the data that is read out of the second memory cell to the second bit line upon driving the second plate line;

outputting, to the first plate line, a first level that is obtained by inverting a logic level of the data on the first bit line, the first logic level being obtained by performing differential amplification; and outputting, to the second plate line, a second level that is obtained by inverting a second logic level of the data on the second bit line, the second logic level being obtained by performing the differential amplification.

* * * * *